(12) United States Patent
Yan et al.

(10) Patent No.: US 9,236,548 B2
(45) Date of Patent: Jan. 12, 2016

(54) METHOD FOR MANUFACTURING LIGHT-EMITTING DEVICES WITH IMPROVED ACTIVE-REGION

(71) Applicant: INVENLUX CORPORATION, El Monte, CA (US)

(72) Inventors: Chunhui Yan, El Monte, CA (US); Jianping Zhang, El Monte, CA (US); Ying Liu, El Monte, CA (US); Fanghai Zhao, El Monte, CA (US)

(73) Assignee: INVENLUX CORPORATION, El Monte, CA (US)

( * ) Notice: Subject to any disclaimer, the term of this patent is extended or adjusted under 35 U.S.C. 154(b) by 0 days.

(21) Appl. No.: 13/846,774

(22) Filed: Mar. 18, 2013

(65) Prior Publication Data

US 2013/0217166 A1    Aug. 22, 2013

Related U.S. Application Data

(62) Division of application No. 12/824,097, filed on Jun. 25, 2010, now Pat. No. 8,421,057.

(51) Int. Cl.
*H01L 33/64* (2010.01)
*H01L 33/24* (2010.01)
*H01L 33/06* (2010.01)

(52) U.S. Cl.
CPC ............... *H01L 33/64* (2013.01); *H01L 33/06* (2013.01); *H01L 33/24* (2013.01)

(58) Field of Classification Search
USPC .......... 438/22, 24, 39, 42; 257/13, 79, 82, 85, 257/86, 90, 94, 97, 98, E33.011, E33.001, 257/E33.008, E21.021, E33.054, E25.028, 257/E25.032, E33.034, E33.03
See application file for complete search history.

(56) References Cited

U.S. PATENT DOCUMENTS

| 7,611,917 B2 | 11/2009 | Emerson et al. |
| 2009/0050924 A1 | 2/2009 | Edmond |
| 2009/0191658 A1* | 7/2009 | Kim et al. ........................ 438/45 |

OTHER PUBLICATIONS

Xianfeng Ni et al., "Reduction of efficiency droop in inGaN light emitting diodes by coupled quantum wells" Applied Physics Letters, vol. 93, Issue 17, (2008), pp. 171113 (3 pages).

* cited by examiner

*Primary Examiner* — Selim Ahmed
(74) *Attorney, Agent, or Firm* — J.C. Patents

(57) ABSTRACT

A light-emitting device comprises an active-region sandwiched between an n-type layer and a p-type layer, that allows lateral carrier injection into the active-region so as to reduce heat generation in the active-region and to minimize additional forward voltage increase associated with bandgap discontinuity. In some embodiments, the active-region is a vertically displaced multiple-quantum-well (MQW) active-region. A method for fabricating the same is also provided.

9 Claims, 18 Drawing Sheets

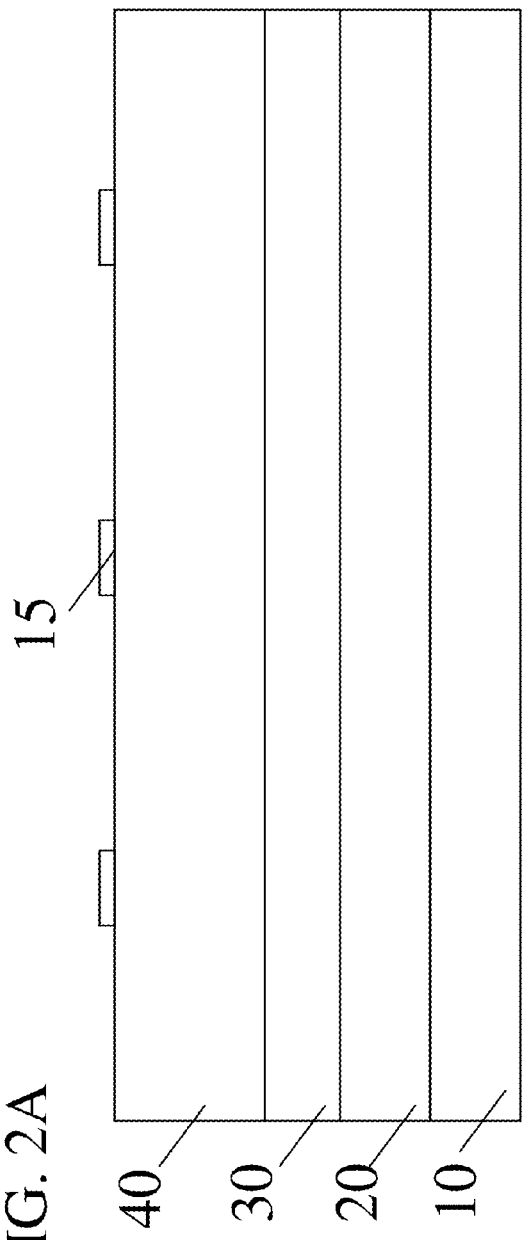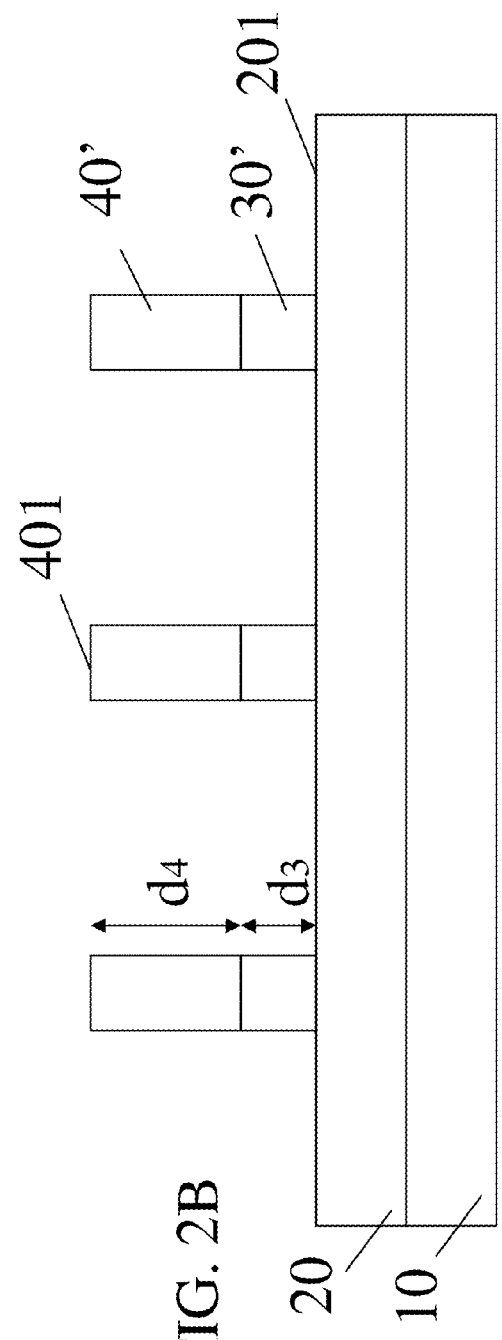

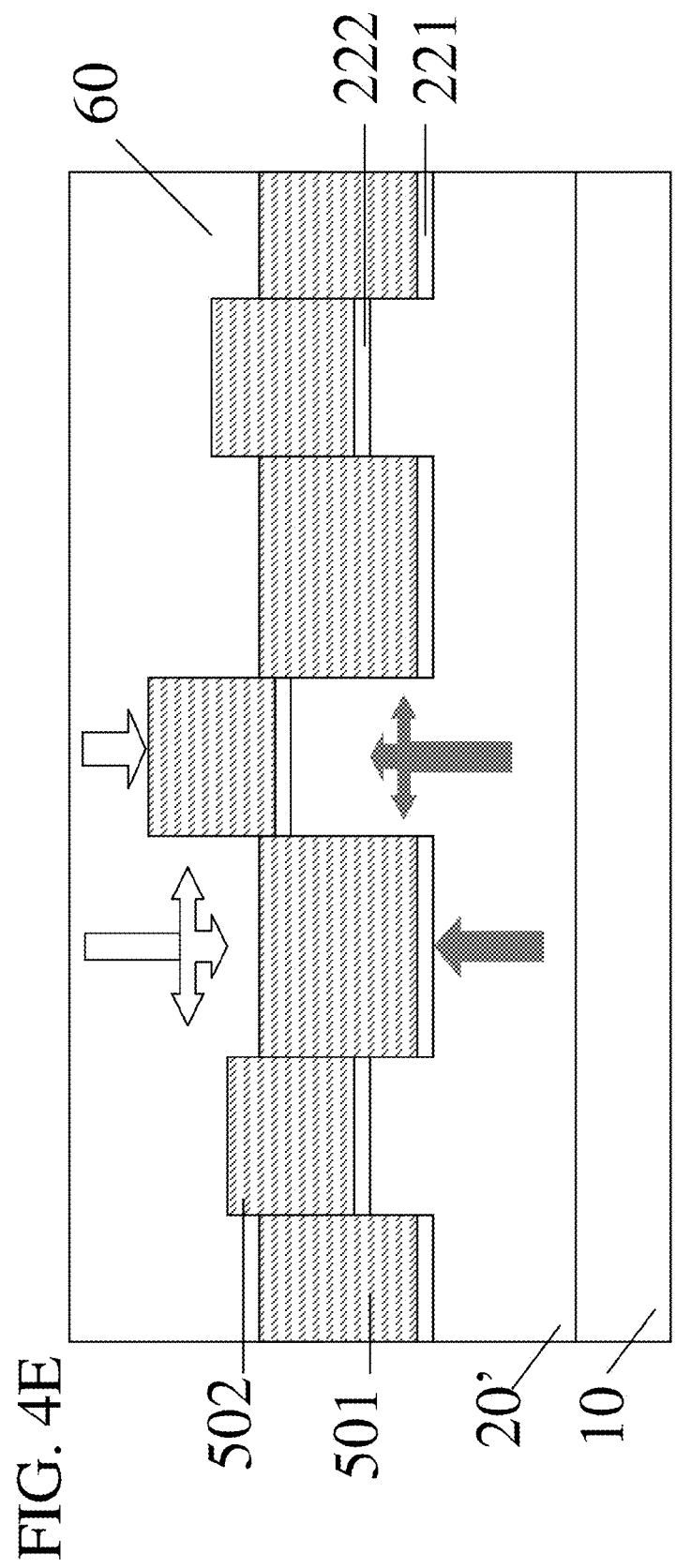

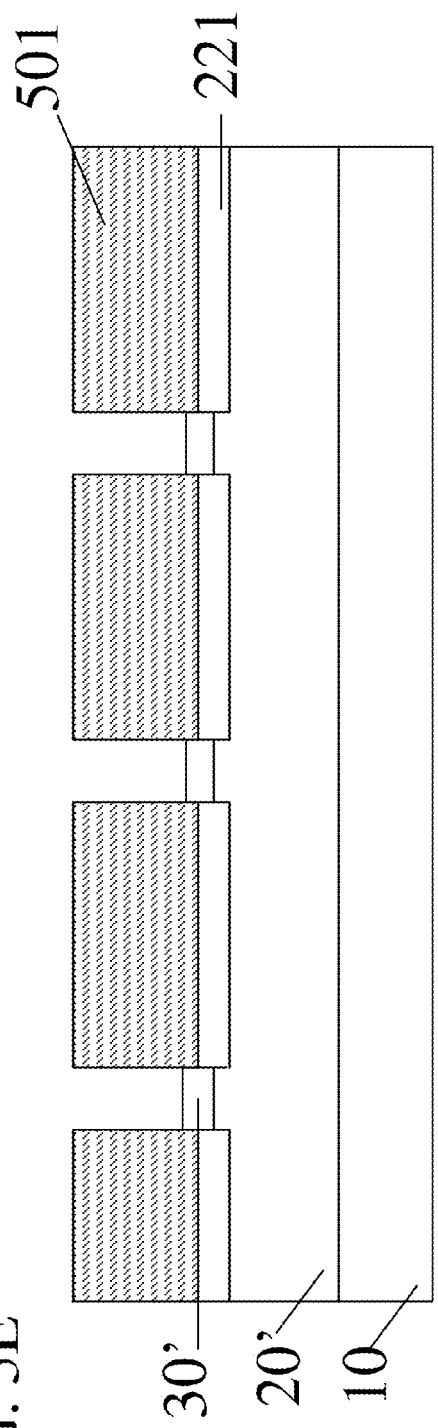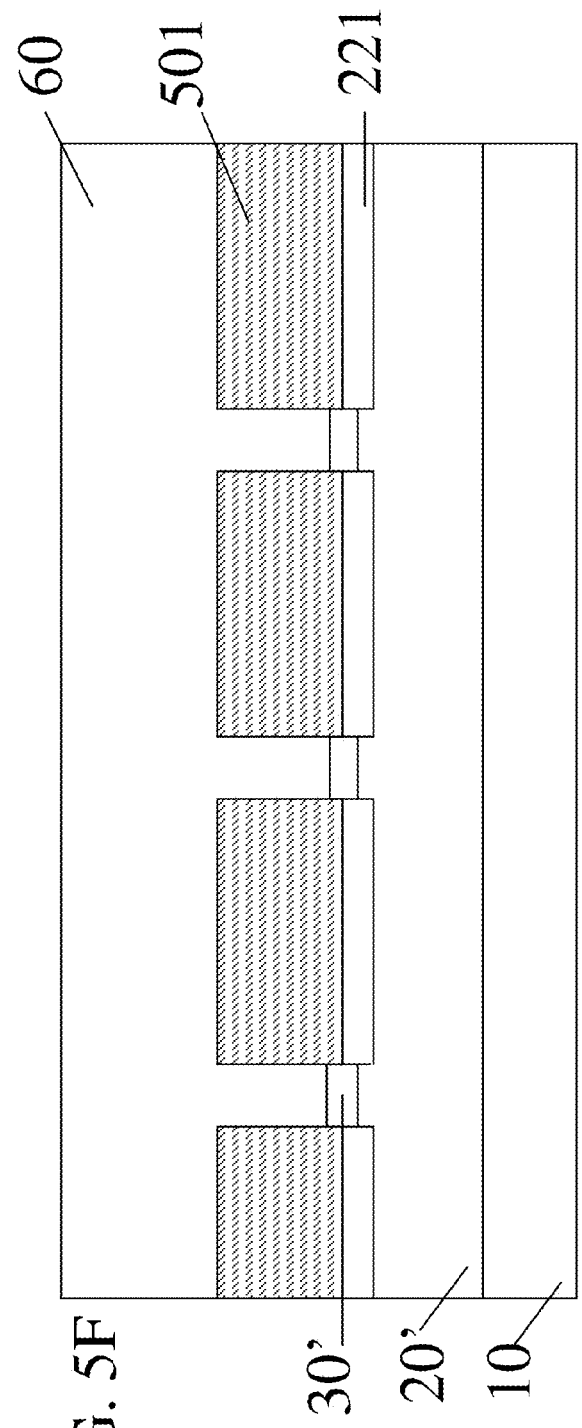

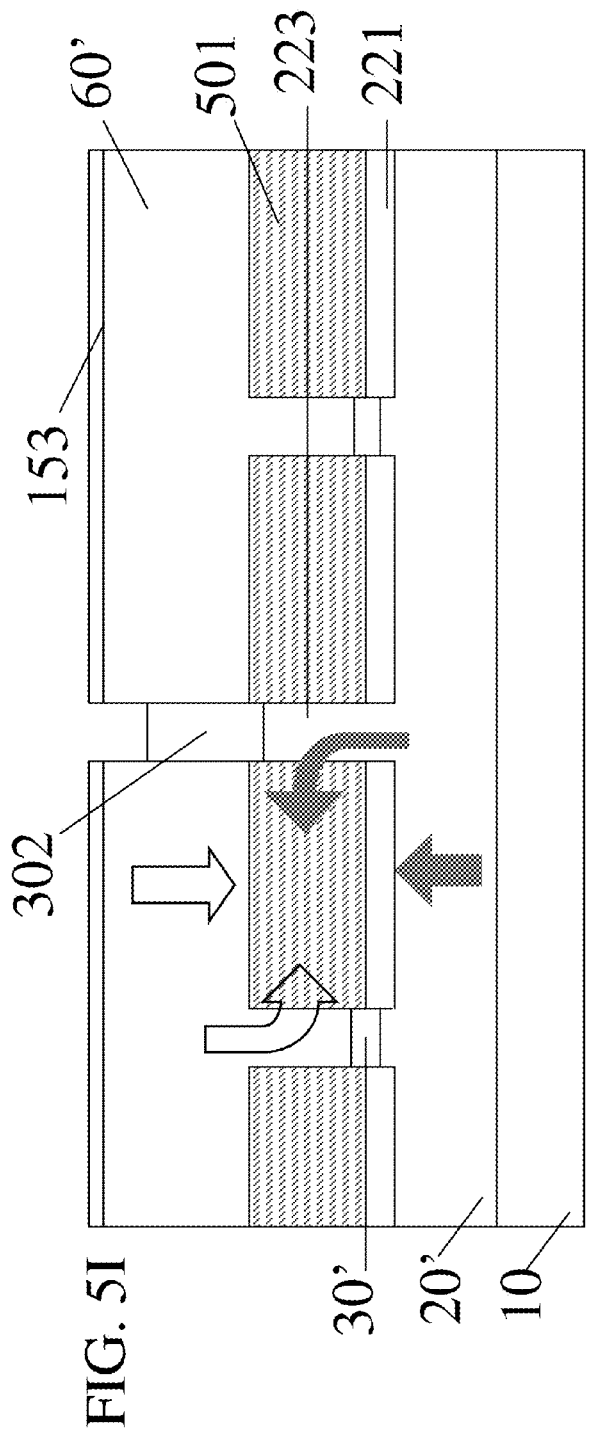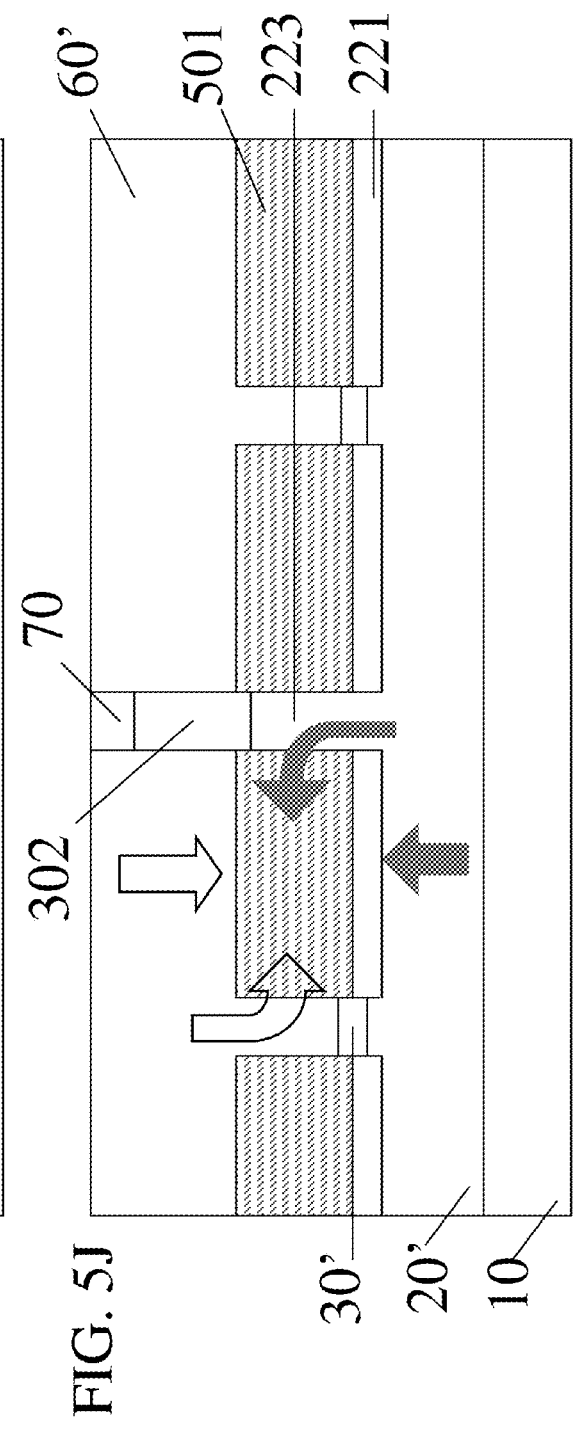

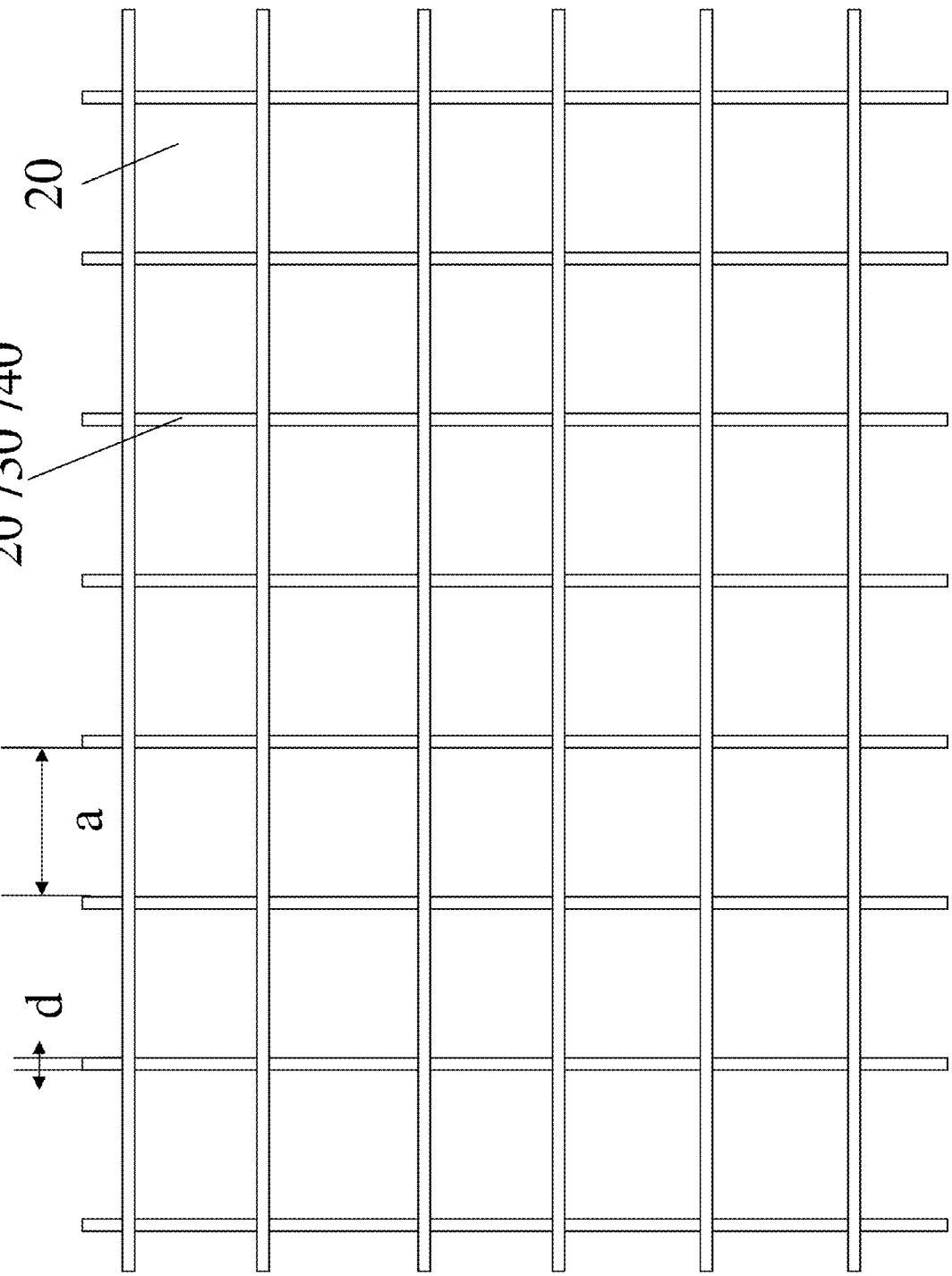

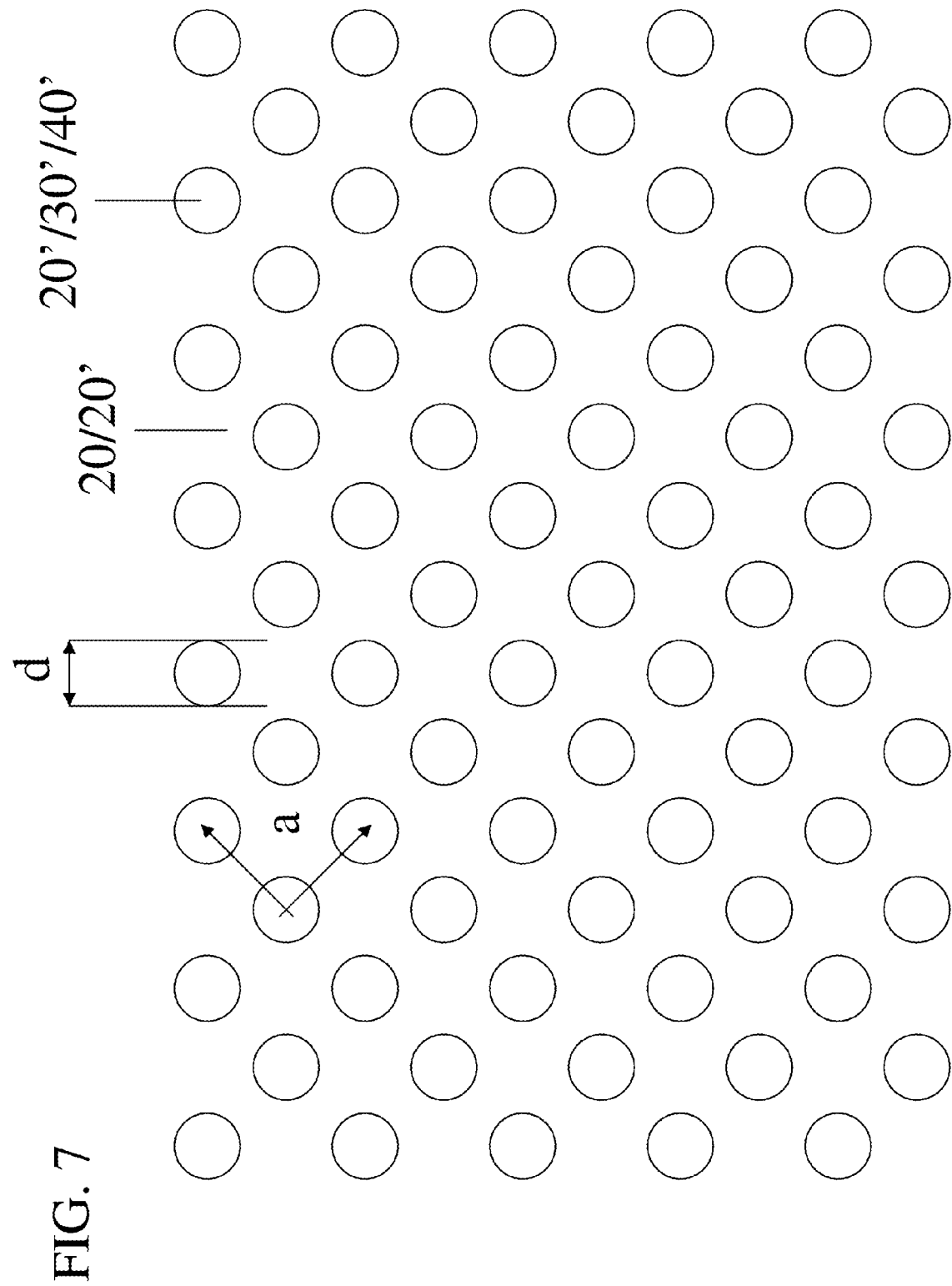

METHOD FOR MANUFACTURING LIGHT-EMITTING DEVICES WITH IMPROVED ACTIVE-REGION

CROSS-REFERENCE TO RELATED APPLICATION

This application is a divisional application of, and claims the priority benefit of, U.S. application Ser. No. 12/824,097 filed on Jun. 25, 2010.

FIELD OF THE INVENTION

The present invention relates in general to light-emitting devices, more particularly to light-emitting devices with enhanced carrier injection, reduced heat generation and light absorption.

DESCRIPTION OF THE RELATED ART

Besides the electron supplier layer (n-type layer) and hole supplier layer (p-type layer), the most important layer in a light-emitting device is the active-region sandwiched between the n-type layer and the p-type layer. Non-equilibrium electrons and holes are injected into the active-region to radiatively recombine, resulting in light-emitting. The injected carriers (electrons and holes) will experience attractive force from carriers with opposite charge type, and repulsive force from carriers with identical charge type. It is the attractive force that helps to form electron-hole pairs and increase electron-hole (e-h) recombination probability. For this reason, it is highly desirable to confine the injected carriers in a limited area/volume to have better light-emitting efficiency. In the past decades, active-region has been developed from three-dimensional (3D), to two-dimensional (2D), even to one- and zero-dimensional (1D, 0D). A 3D active-region is made of a quasi bulk material without any quantum confinement effect, where carriers can diffuse three-dimensionally and the e-h recombination probability is low. A 2D active-region has quantum confinement usually in the direction of carrier injection, commonly of multiple-quantum-well (MQW) configuration. 1D and 0D active-regions implement additional quantum confinement in other directions, with quantum wire and quantum dot as representatives.

Compared to 3D active-region, 2D MQW active-region has much higher e-h recombination probability yet without adding fabrication complexity. MQW thus is the most commonly adopted active-region for modern light-emitting devices.

An MQW consists of many alternating quantum barriers (also referred to as barrier throughout this specification) and quantum wells (also referred to as well throughout this specification), with quantum barriers having larger bandgap energy. When sandwiching quantum wells, these barriers provide quantum confinement to carriers injected into quantum wells, leading to a superior radiative recombination rate. The band structure of an exemplary GaN/InGaN MQW LED is given in FIG. 1. As shown, the GaN barriers and InGaN wells have band discontinuities in conduction band as well as in valence band. Usually, the band discontinuity in conduction band is more pronounced, forming potential barriers for the electrons in the wells. The valence band discontinuity provides potential barriers to confine holes in the quantum wells. Thus, injected non-equilibrium electrons and holes are confined in the quantum wells, in the direction perpendicular to the quantum well layer, which coincides with the carrier injection direction in the prior art light-emitting device. This confinement greatly increases the electron-hole oscillation strength, leading to enhanced e-h recombination probability.

However, the inventors point out that there are certain drawbacks in the prior art practice using MQW as active region. Referring to FIG. 1(holes illustrated by hollow circles), when carriers are driven from quantum barriers into quantum wells, there is a potential energy loss of the carriers. This potential energy will be converted first into carriers' kinetic energy, then totally into heat as carriers relax their kinetic energy via phonons emission. The heat generation for electrons injection is severer since conduction band discontinuity is larger than valence band discontinuity.

For example, in commercial blue/green LEDs, GaN and InGaN are used as quantum barrier and quantum well materials in the MQW, respectively. There is a bandgap discontinuity of 0.5-0.8 eV between the quantum barriers and quantum wells. When these commercial LEDs are driven under 1 A current for general lighting applications, according to the inventors' finding, there is 0.5-0.8 watt heat generated in the MQW active-region, because of the perpendicular carrier injection to the MQW and the bandgap discontinuity in that direction. This heat associated with MQW bandgap discontinuity, being generated right inside the light-emitting region, is expected to be very deleterious to the electric-optical power conversion efficiency. Especially in the high current injection regime, this heat generation could be the root for the commonly observed efficiency droop (efficiency droop is explained in US patent application publication No. 2009/0050924, the contents of which is hereby incorporated by reference in its entirety).

Another disadvantage of the prior art MQW structure is that carriers are repeatedly pumped up into barriers from wells in order to reach the furthest quantum wells. Referring to FIG. 1, electrons first injected into QW1 (first quantum well) have to be pumped up into additional barriers in order to reach QW2 (second quantum well) and QW3 (third quantum well). This increases device resistance and, thus, increases device forward voltage. Ni et al (*Reduction of efficiency droop in InGaN light emitting diodes by coupled quantum wells*, Appl. Phys. Lett. 93, 171113 (2008)) has reported to use thin quantum barriers in order to facilitate carriers' tunneling transport. However, tunneling barriers inevitably has less quantum confinement effect, leading to a reduced radiative recombination rate.

U.S. Pat. No. 7,611,917, the contents of which is hereby incorporated by reference in its entirety, describes a method to generate growth pits in the epilayer and expects the light-emitting active-region can extend into the pits area, enabling improved hole injection. Similarly, US patent application publication No. 2009/0191658, the contents of which is hereby incorporated by reference in its entirety, also proposes growth pits for enhanced hole injection. Further, US 2009/0191658 suggests ion implantation or diffusion as a post-growth approach to form p-type region penetrating active-region. It also mentions selective etching of active-region and performing p-type layer regrowth to fill up the etched active-region. All these approaches in general can result in better hole injection. While the pits formation approach sacrifices the device structure quality, the other post-growth approaches will damage the active-region. This means that the approaches proposed by U.S. Pat. No. 7,611,917 and US patent application publication No. 2009/0191658 will lead to degraded device performance such as large device leakage current, poor reverse sustaining voltage and low electrostatic discharge performance.

In brief, modern light-emitting devices utilizing heterostrucutres greatly improves light-generation efficiency. However, the bandgap discontinuity associated with heterostrucutre will inevitably set up barriers for carrier's injection in the direction perpendicular to the heterostrucutre interfaces (heterointerfaces). This hindrance to carrier's injection will become much severer for wide bandgap semiconductors where carriers have large effective mass. Also, when being injected from a wide bandgap layer to a narrow bandgap layer, carriers lose the potential energy by emitting phonons. This carrier-lattice interaction process produces heat which will reduce light-emitting device's efficiency, especially when the device is driven under high current-injection regime for general lighting applications.

SUMMARY OF THE INVENTION

The present invention discloses new carrier injection schemes to reduce or avoid heat generation in MQW and to minimize or eliminate additional forward voltage increase associated with bandgap discontinuity.

One aspect of the present invention provides a light-emitting device that comprises an n-type layer, a p-type layer, and an active-region, wherein the n-type layer is in contact with the active-region in a first contact area substantially perpendicular to the active-region for laterally injecting electrons into the active-region.

Preferably, the p-type layer is also in contact with the active-region in a second contact area substantially perpendicular to the active-region for laterally injecting holes into the active-region. Preferably, the active-region is made of multiple barrier layers and well layers. In some embodiments, the active-region contains 20-50 pairs of the well layers and the barrier layers.

In some embodiments, the total thickness of the active-region is in the range from 400 nm to 1000 nm. The thickness of each of the barrier layers is in the range from 10 nm to 300 nm. In some embodiments, at least two of the well layers emit different wavelength emissions with a peak wavelength difference at least 10 nm.

The substrate for accommodating the n-type layer, the p-type layer, and the active-region can be selected from the group consisting of GaN, sapphire, silicon, silicon carbide, zinc oxide, quartz, glass and gallium arsenide.

Another aspect of the present invention provides a light-emitting device that comprises an n-type layer, a p-type layer, and a vertically displaced active-region sandwiched between the n-type layer and the p-type layer.

The active-region contains a plurality of volume units, each being defined by a top surface, a bottom surface and a sidewall; adjacent volume units are vertically displaced so that the top surfaces of the adjacent volume units are not in a plane, or the bottom surfaces of the adjacent volume units are not in a plane; the sidewalls of the volume units are divided into two groups, a first group of sidewalls are exposed to the n-type layer for receiving electrons laterally injected from the n-type layer, a second group of sidewalls are exposed to the p-type layer for receiving holes laterally injected from the p-type layer. Each of the sidewalls exposes more than one well layer.

In some embodiments, the top surfaces of the volume units substantially lie in two vertically separated planes, respectively, or in more than two vertically separated planes, respectively.

In some embodiments, all of the volume units have the same number of well layers and substantially the same height, and adjacent volume units share a vertically overlapping portion that contains at least one well layer.

In some embodiments, the ratio of a contact surface area between the n-type layer and a first group of sidewalls of the volume units to a contact surface area between the p-type layer and a second group of sidewalls of the volume units is in the range of 0.5 to 2.

Another aspect of the present invention provides a light-emitting device that comprises an n-type layer, a p-type layer, and a light-emitting active-region sandwiched between the n-type layer and the p-type layer, wherein the active-region has a plurality of first projections protruding towards the n-type layer, sidewalls of the first projections are exposed to the n-type layer and able to receive electrons laterally injected from the n-type layer.

In some embodiments, the active-region further has a plurality of second projections protruding towards the p-type layer, sidewalls of the second projections are exposed to the p-type layer and able to receive holes laterally injected from the p-type layer.

Preferably, the active-region comprises multiple well layers and barrier layers, the sidewalls of the first projections expose more than one well layer.

In some embodiments, the first projections comprise projections that are separated from each other. In some other embodiments, the first projections comprise projections that are connected with each other to form a continuous structure.

Another aspect of the present invention provides a light-emitting device that comprises an n-type layer with a plurality of first projections, a p-type layer, and a light-emitting active-region with multiple well layers and barrier layers sandwiched between the n-type layer and the p-type layer. The active-region has a plurality of first recesses corresponding to the first projections of the n-type layer, each of the first recesses accommodates one of the first projections, and sidewalls of the first recesses expose more than one well layer and are able to receive electrons laterally injected from the first projections of the n-type layer.

In some embodiments, the active-region also has a plurality of second recesses, the p-type layer has a plurality of second projections, each of the second recesses accommodates one of the second projections, and sidewalls of the second recesses expose more than one well layer and are able to receive holes laterally injected from the second projections of the p-type layer.

In some embodiment, the first recesses penetrate the entire active-region and are partially filled with a p-type material and an insulating material which separates the p-type material from the first projections, and the p-type material is connected to the p-type layer.

In some embodiments, the first projections comprise projections that are separated from each other. In some embodiments, the first projections comprise projections that are connected with each other to form a continuous structure.

In some embodiments, the second recesses penetrate the entire active-region and are partially filled with an insulating material so as to separate the second projections from the n-type layer. In some embodiments, the first recesses penetrate the entire active-region and are partially filled with another insulating material so as to separate the first projections from the p-type layer.

Another aspect of the present invention provides a method for manufacturing a light-emitting device. The method comprises providing an n-type layer deposited over a substrate; patterning the n-type layer to form a plurality of recesses defining a first group of surfaces and a second group of surfaces vertically displaced from the first group of surfaces; depositing an active-region over and conformable to the surface of the n-type layer, so that a first portion of the active-region is formed on the first group of surfaces and a second portion of the active-region is formed on the second group of surfaces, wherein the first portion of the active-region is vertically displaced from the second portion of the active-region; and depositing a p-type layer over and conformable to the active-region, Preferably, the step of depositing the active-region includes alternately depositing multiple well layers and barrier layers. Sidewalls of the first portion of the active-region that are in contact with the n-type layer expose at least one well layer and sidewalls of the second portion of the active-region that are in contact with the p-type layer expose at least one well layer.

In some embodiments, the method includes, before depositing the active-region, further depositing a recovery n-type layer on the n-type layer, which covers the first group of surfaces and the second group of surfaces of the n-type layer.

In some embodiments, the method includes, before depositing the active-region, further depositing an insulating layer on the n-type layer, which covers the first group of surfaces and the second group of surfaces of the n-type layer, but does not cover sidewalls connecting the first group of surfaces and the second group of surfaces.

Another aspect of the present invention provides a method for manufacturing a light-emitting device. The method comprises:

providing an n-type layer deposited over a substrate; forming an insulating layer on the n-type layer;

patterning the insulating layer to remove exposed portion of the insulating layer and a portion of the n-type layer below the exposed portion of the insulating layer, resulting in a first group of surfaces of a remaining insulation layer and a second group of surfaces of a remaining n-type layer vertically displaced with the first group of surfaces;

depositing an active-region, so that a first portion of the active-region is formed on the first group of surfaces and a second portion of the active-region is formed on the second group of surfaces;

removing the first portion of the active-region to expose the remaining insulating layer;

depositing a p-type layer over the active-region to cover top surface of the active-region, wherein a portion of the p-type layer fills the space that was occupied by the removed first portion of the active-region to form a plurality of hole injection plugs;

patterning and etching the p-type layer to remove some of the hole injection plugs and the remaining insulating layer therebeneath until the n-type layer is expose so as to form a plurality of electron injection plug holes; and depositing another n-type layer into the plurality of electron injection holes to form a plurality of electron injection plugs; and depositing another insulating layer on the plurality of electron injection plugs to insulate the plurality of electron injection plugs from the p-type layer.

Preferably, the step of depositing the active-region includes alternately depositing multiple well layers and barrier layers. The hole injection plugs are in contact with at least one well layer, and the electron injection plugs are in contact with at least one well layer.

In some embodiments, the method includes, before depositing the active-region, further depositing a recovery n-type layer on the n-type layer, which covers the first group of surfaces and the second group of surfaces.

Another aspect of the present invention provides a method for manufacturing a light-emitting device. The method comprises:

providing a p-type layer, an insulating layer, and an n-type layer deposited over a substrate;

patterning and etching the p-type layer and the insulating layer until the n-type layer is exposed, so as to form a plurality of projections containing a remaining portion of the p-type layer and a remaining portion of the insulating layer;

depositing an active-region with multiple well layers and barrier layers over the substrate so that the projections penetrate the active-region and expose the remaining portion of the p-type layer to more than one well layers.

In some embodiments, the step of patterning and etching the p-type layer and the insulating layer etches into the n-type layer for a predetermined thickness.

BRIEF DESCRIPTION OF THE DRAWINGS

The accompanying drawings, which are included to provide a further understanding of the invention and constitute a part of this application, illustrate embodiments of the invention and together with the description serve to explain the principle of the invention. Like reference numbers in the figures refer to like elements throughout, and a layer can refer to a group of layers associated with the same function.

FIG. 2A-FIG. 2D illustrate the structure and fabrication process flow of an embodiment according to the present invention.

FIG. 4A-FIG. 4E illustrate the structure and fabrication process flow of an embodiment according to the present invention.

FIG. 5A-FIG. 5J illustrate the structure and fabrication process flow of an embodiment according to the present invention.

FIG. 6 shows an example of two-dimensional etch pattern, a square grid.

FIG. 7 shows an example of two-dimensional etch pattern, a square lattice of circles.

DETAILED DESCRIPTION OF EMBODIMENTS

Figure 1:
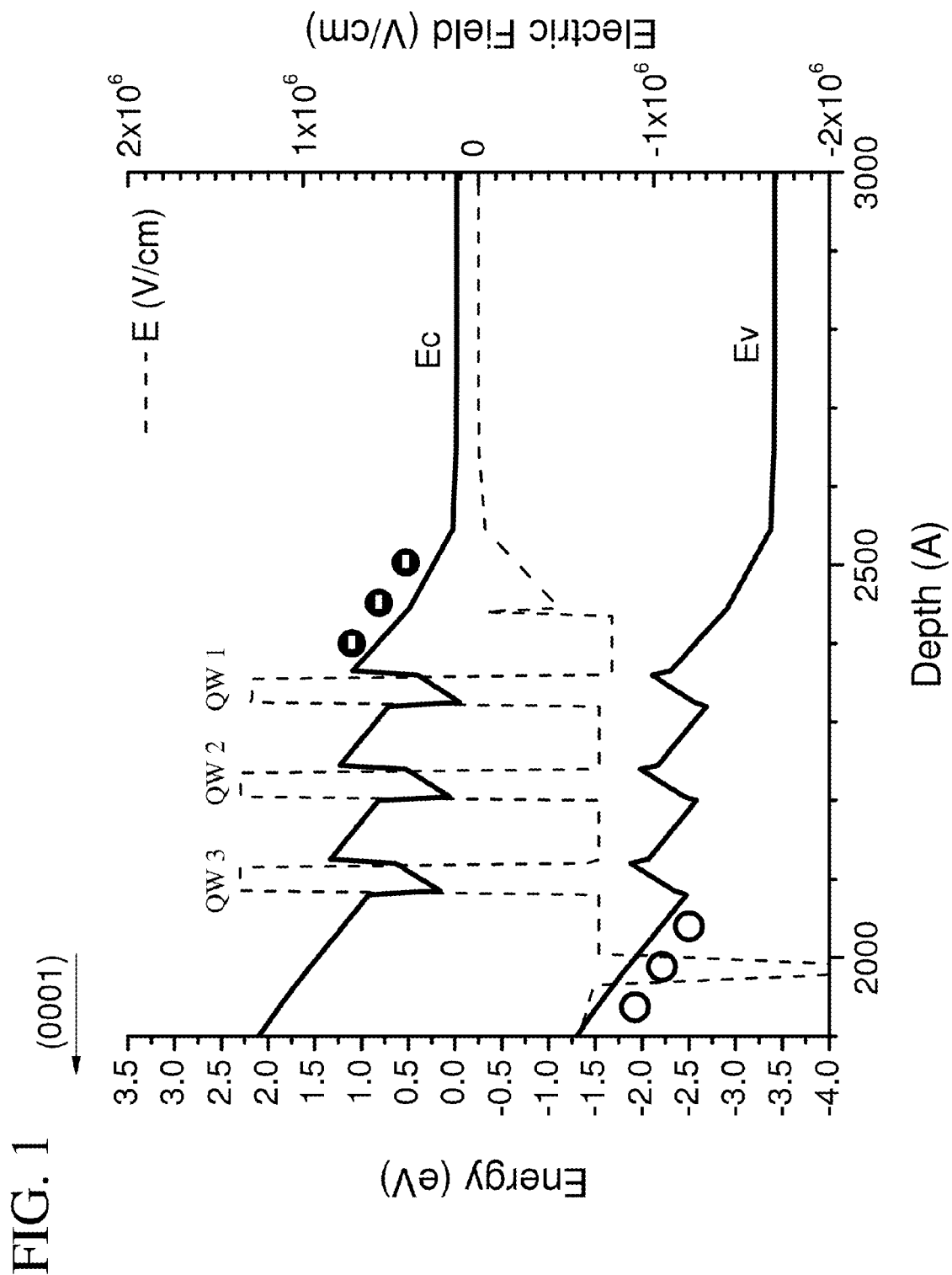
FIG. 1 shows the calculated band structure of a GaN/InGaN MQW LED under zero bias.

The principle of the present invention can be applied to light-emitting devices such as LEDs, laser diodes, and can also be applied to photo detector diodes by those who are skilled in the art based on the teachings in this specification. For convenience and simplicity, the inventors use GaN-based LEDs as an example to describe the embodiments of the present inventions. It should be understood that the present invention is by no means limited to GaN-based LEDs.

According to one aspect of the present invention, a light-emitting device, or a light emitting diode (LED) capable of injecting holes in direction parallel to MQW layers, or capable of lateral injection of holes into MQW is provided. The structure and fabrication process of such light-emitting device are disclosed. The fabrication process includes these steps:

to provide a template, which includes a thick n-type semiconductor layer deposited over a substrate, an insulating semiconductor layer deposited over the n-type layer, and a p-type semiconductor layer deposited on the insulating layer;

to shape the template, which includes to form masks on the template, to perform etching to access the n-type layer through the unmasked areas and form two groups of vertically displaced surfaces, and to remove the masks;

to resume LED growth on the shaped template, which includes to deposit a thin n-type layer to recover the surfaces, to deposit MQW active-region over the recovered surfaces, and to deposit p-type layers over the MQW active-region.

According to another aspect of the present invention, an LED capable of lateral injection of holes and electrons is provided. The fabrication process includes:

to provide a template which includes a thick n-type semiconductor layer deposited over a substrate;

to shape the template, which includes to form masks on the template, to perform etching to form two groups of vertically displaced surfaces, and to remove the masks;

to resume LED growth on the shaped template, which includes to deposit a thin n-type layer to recover the surfaces, to deposit MQW active-region over the recovered surfaces, and to deposit p-type layers over the MQW active-region.

According to still another aspect of the present invention, an LED capable of lateral injection of electrons is provided. The fabrication process includes:

to provide a template which includes a thick n-type semiconductor layer deposited over a substrate, an insulating semiconductor layer deposited over the n-type layer;

to shape the template, which includes to form masks on the template, to perform etching to access the n-type layer through the unmasked areas and form two groups of vertically displaced surfaces, and to remove the masks;

to resume LED growth on the shaped template, which includes to deposit a thin n-type or insulating layer to recover the surfaces, to deposit MQW active-region over the recovered surfaces, and to deposit p-type layers over the MQW active-region.

According to still another aspect of the present invention, an LED enabling simultaneous lateral injection of electrons and holes into the same MQW active-region is provided. The fabrication process includes:

to provide a template which includes a thick n-type semiconductor layer deposited over a substrate, an insulating semiconductor layer deposited over the n-type layer;

to shape the template, which includes to form masks on the template, to perform etching to access the n-type layer through the unmasked areas and form two groups of vertically displaced surfaces, and to remove the masks;

to resume epitaxial growth on the shaped template, which includes to deposit a thin n-type or insulating layer to recover the surfaces, to deposit MQW active-region over the recovered surfaces;

to form masks a second time, covering/protecting the recessed MQW areas;

to perform etch a second time, to remove the unmasked MQW areas;

to remove the second masks, and resume p-layers growth;

to form masks a third time, and perform etch to access the n-type layer;

to resume epitaxial growth of an n-type layer and an insulating layer, with the n-type layer grown first in contact with the bottom n-type layer over substrate.

Figure 2C:
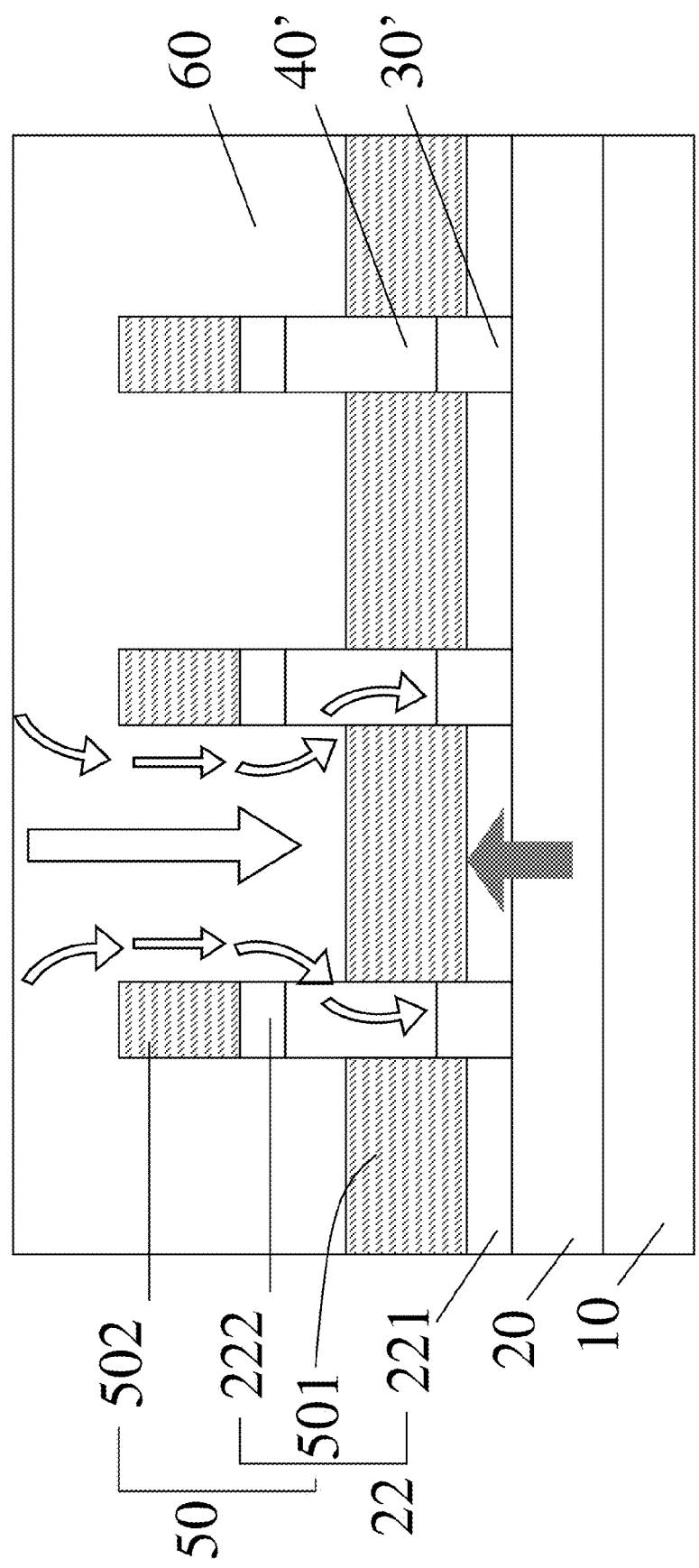

FIG. 2A-FIG. 2D illustrate the structure and fabrication process of an LED embodiment of the present invention enabling lateral hole injection into MQW active-region. Referring to FIG. 2A, an n-type layer 20 is deposited over a substrate 10. The n-type layer 20 can be made of the same material as that of the substrate 10, or can be made of different material, i.e., n-type layer 20 can be grown homoepitaxially or heteroepitaxially on substrate 10. In the case of heteroepitaxial growth, there may be other layers formed between n-type layer 20 and substrate 10, such as a buffer layer to accommodate lattice mismatch between n-type layer 20 and substrate 10. In the case of GaN-based LEDs, n-type layer 20 can be Si-doped GaN, Si-doped AlGaN, or Si-doped InGaN layer. Substrate 10 can be made of GaN, sapphire, silicon, silicon carbide, quartz, zinc oxide, glass and gallium arsenide, and the like used in the field of interest. On top of n-type layer 20 is formed an insulating layer 30, which is followed by a p-type layer 40. The insulating layer 30 can be insulating GaN such as intrinsic GaN, iron doped GaN, or highly compensated doped GaN layer, or insulating AlGaN or AlN layer. Insulating layer 30 is used for electrical isolation so its resistivity is preferred to be high, preferably to be higher than 100 Ω·cm, more preferably to be higher than 1000 Ω·cm. P-type layer 40 can be p-type nitride such as magnesium doped GaN, InGaN, or AlGaN layer.

Referring to FIG. 2A and FIG. 2B, a mask 15 is used to define etch patterns. The etch depth should be equal to or greater than the sum of thickness $d_3$ of insulating layer 30 and thickness $d_4$ of p-type layer 40, to expose n-type layer 20 and allow full electrical access to n-type layer 20 by an active-region formed later. Thickness, $d_3$, of insulating layer 30 is preferably in the range of 0.1 μm-0.5 μm, and thickness, $d_4$, of p-type layer 40 is preferably in the range of 0.2 μm-0.6 μm, but $d_3$ and $d_4$ are not limited to these thickness ranges.

Figure 2D:
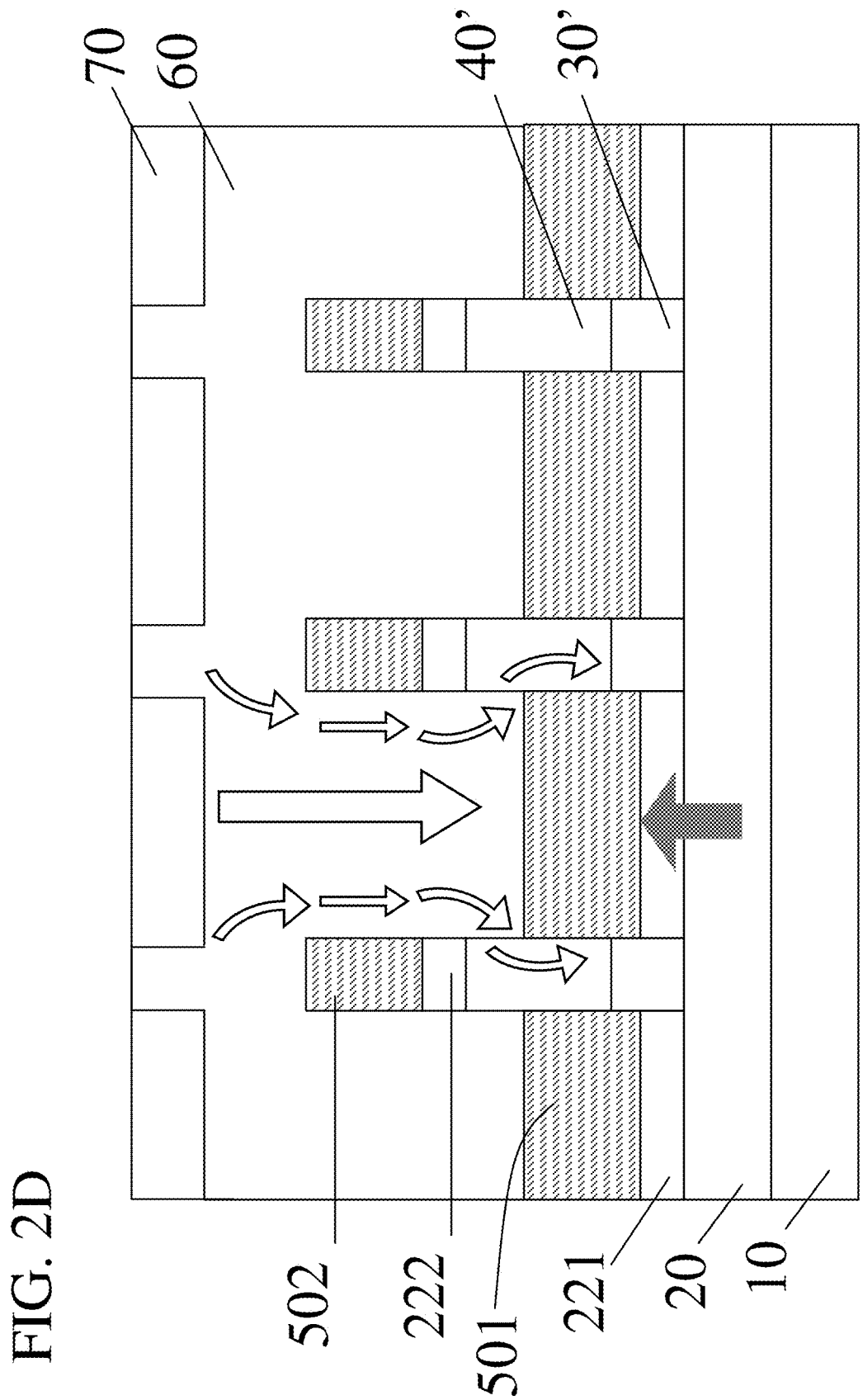

After etching, mask 15 is removed to expose top surface 401 of remaining p-type layer 40' and top surface 201 of a portion of n-type layer 20. The two groups of surfaces 401 and 201 are vertically displaced as shown in FIG. 2B, for the following LED structure growth, which starts with the deposition of an optional recovery n-type layer 22 to recover/refresh the etched surfaces of n-type layer 20 for next MQW active-region growth. The recovery n-type layer 22 can be GaN, InGaN, or AlGaN layer, with thickness from 0.1 to a few microns, for example 3 μm. Preferably, the recovery layer thickness is in the range of 0.1-0.5 microns. Referring to FIG. 2C, recovery n-type layer 22 includes two portions: layers 221 and 222 recovering surfaces 201 and 401, respectively. The thickness of layer 221 should be less than the sum of the thickness of remaining insulating layer 30' and the thickness etched into n-type layer 20, so that layer 221 is not in direct contact with remaining p-type layer 40'. An MQW active-region 50 (including active-region 501 formed on layer 221 and active-region 502 formed on layer 222) is then deposited layer-by-layer over recovery n-type layers 221 and 222. The MQW active-region 50 is in general made of alternate AlInGaN quantum barriers and AlInGaN quantum wells, with GaN or InGaN barriers and InGaN wells as a special case. Finally, over the MQW active-region 50 a thick p-type layer 60 is grown to finish the structure. Depending on the etch depth and the regrowth thickness, layer 60 can have a flat surface (FIG. 2C) or an uneven surface (FIG. 2D). When the surface of layer 60 is uneven, other materials with different refractive index can be filled to smooth the uneven surface. As shown in FIG. 2D, uneven surface of layer 60 is smoothened out by filling material 70. Material 70 can be dielectrics like silicon dioxide, silicon nitride, or be transparent conducting oxides like ITO.

With the structure shown in FIGS. 2C and 2D, lateral hole injection into MQW active-region 501 is realized. In FIG. 2C and FIG. 2D, hole current and electron current are represented by hollow and solid arrows, respectively. As seen, besides the conventional perpendicular hole injection, there is substantial lateral hole injection into MQW active-region 501 via sidewalls of remaining p-type layer 40'. Since MQW active-region 501 strides over sidewalls of remaining insulating layer 30' and sidewalls of remaining p-type layer 40', hole lateral injection into sidewalls of MQW active-region 501 is implemented while leakage path being eliminated from remaining p-type layer 40' to recovery n-type layer 221.

Optionally, MQW active-region 502 and/or recovery n-type layer 222 can be removed before depositing p-type layer 60. Optionally, other layer such as a p-type layer with larger bandgap energy than p-type layer 60 can be formed between p-type layer 60 and MQW active-region 501.

Depending on the etch patterns defined by mask 15, the laterally injected hole current component can be adjusted. The etch patterns can be one dimensional, or two dimensional. A simple one dimensional pattern is a group of parallel strips, and a simple two dimensional pattern can be formed by two groups of parallel strips intercrossing from each other. Shown in FIG. 6 is an example of the so-formed two dimensional pattern, a square grid formed by two perpendicular groups of parallel strips. Referring FIGS. 2B and 6, when FIG. 6 is taken as a top view of an example structure of FIG. 2B, the upwardly protruding strips are formed by a stack of the remaining p-type layer 40', the remaining insulating layer 30' and, optionally, a certain thickness of n-type layer 20 (if n-type layer 20 is being partially etched while etching p-type layer 40 and insulating layer 30) with an upper surface 401. The recessed squares surrounded by the strips expose the upper surface 201 of n-type layer 20 for receiving recovery n-type layer 221 or for direct epitaxial growth of active-region 501. The recessed squares may be replaced by other regular or irregular shapes such as triangle, polygon, circle, or the combination of different shapes.

In this case the laterally injected hole current component is proportional to $(2d \cdot a/(a^2+2d \cdot a))$ (additional resistance from remaining p-type layer 40' is not considered), here d and a are the strip's (or sidewall's) width and the recessed square's length, respectively. In some embodiments, strip width d is in the range of 1-10 µm, and square side length a in the range of 5-50 µm. Since MQW active-region 502 grown on top of the remaining p-type layer 40' does not contribute to light-generation, d is not preferred to be too wide. On the other hand, since laterally injected hole current is nearly proportional to d, d has to be large enough.

Another two dimensional pattern is shown in FIG. 7 with square lattice. FIG. 7 can be taken as a top view of another example structure of FIG. 2B. The circles with diameter d represent upwardly protruding lateral hole injecting cylinders, where d is less than a/2, for example less than a/4 or a/8, and a is the two dimensional lattice constant. In this case, the upwardly protruding lateral hole injecting cylinders are formed by a stack of the remaining p-type layer 40', the remaining insulating layer 30' and, optionally, a certain thickness of n-type layer 20 (if n-type layer 20 is being partially etched while etching p-type layer 40 and insulating layer 30) with an upper surface 401. The recessed areas other than the upwardly protruding lateral hole injecting cylinders expose the upper surface 201 of n-type layer 20 for receiving recovery n-type layer 221 or for direct epitaxial growth of active-region 501. Here, the laterally injected hole current is proportional to $(d/a)^2$. The upwardly protruding lateral hole injecting cylinders may have other regular or irregular cross-sectional shapes other than circle shape.

All other suitable one or two dimensional patterns can be used in these embodiments.

Optionally, a thin insulating layer (not shown in FIG. 2C and FIG. 2D) can be deposited between p-type layer 60 and MQW active-region 501, for example in direct contact with MQW active-region 501, then the perpendicular hole injection into MQW active-region 501 is forbidden and only the lateral injection path is open, realizing a completely hole lateral injection. If desirable, p-type layer 60 can be made partially in contact with MQW active-region 501, e.g., the thin insulating layer only covers a portion of MQW active-region 501 and the other portion of MQW active-region 501 is exposed to p-type layer 60. As explained in the previous sections, lateral hole injection reduces heat generation in an active-region, especially in an MQW active-region associated with valence band discontinuity, and results in a more uniform hole distribution in the active-region.

Figure 3A:
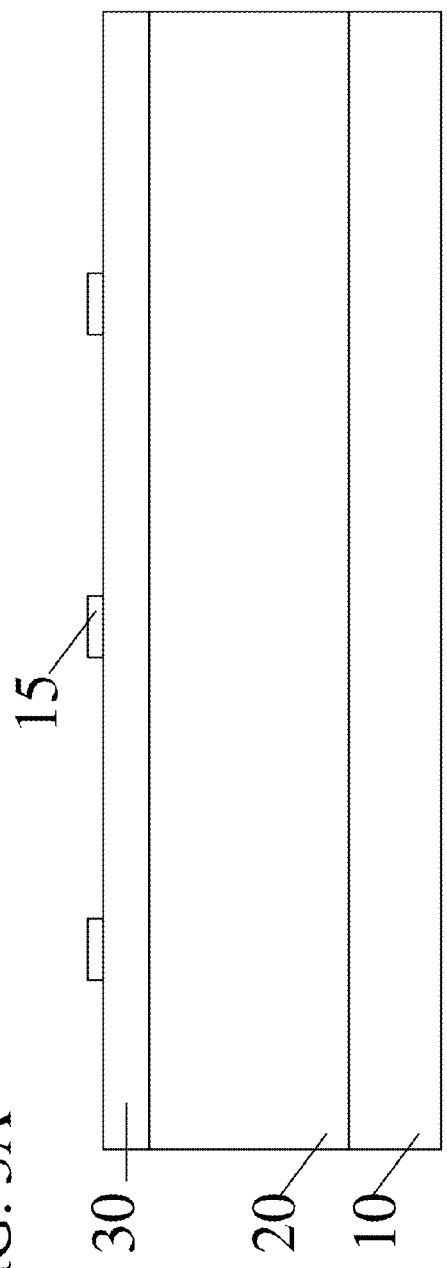
FIG. 3A-FIG. 3C illustrate the structure and fabrication process flow of an embodiment according to the present invention.
Figure 3B:
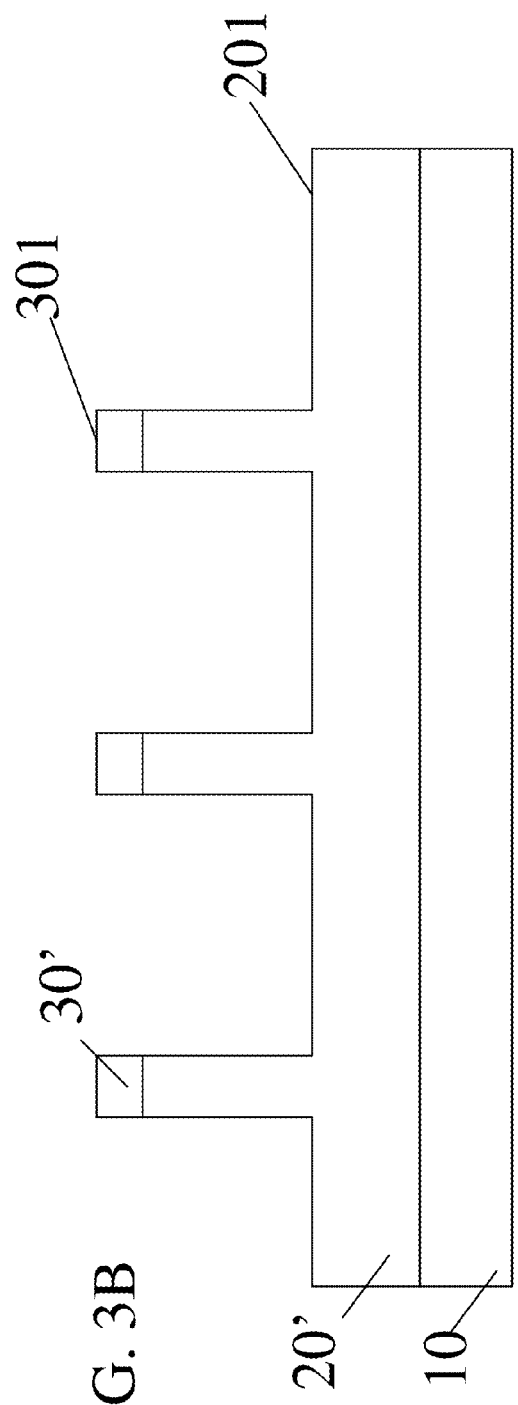
Figure 3C:
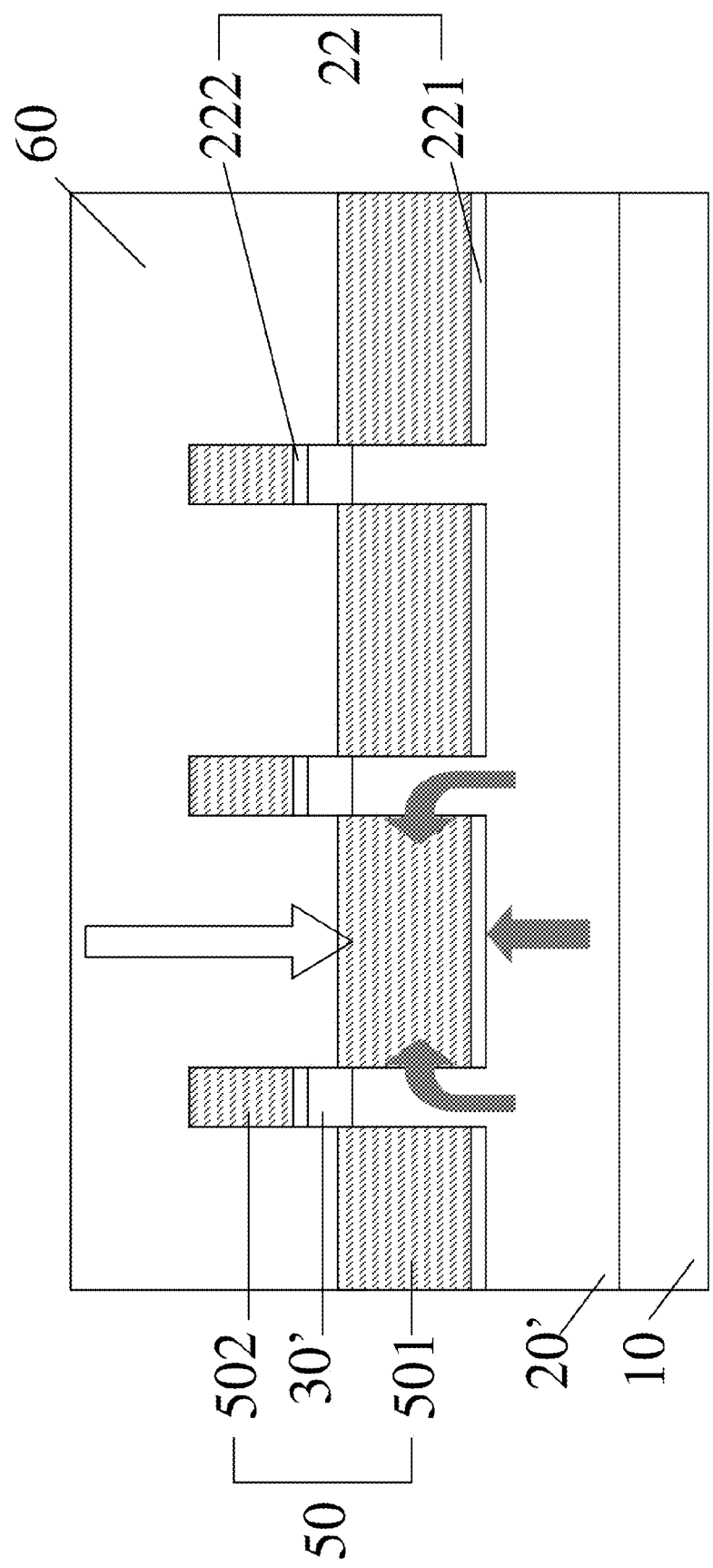

FIG. 3A-FIG. 3C illustrate a structure and fabrication process flow of an LED capable of laterally injecting electrons into an active-region, especially an MQW active-region according to another embodiment of the present invention. Lateral electron injection has the same importance as lateral hole injection since this will minimize the possibility of hot electrons and electrons overflow in an MQW active-region. In terms of reducing heat in MQW active-region, lateral electron injection is expected to play a more important role since the bandgap discontinuity is mostly distributed in conduction band (accounts for 60-80%). As shown in FIG. 3A, an n-type layer 20 is deposited over a substrate 10. The n-type layer 20 can be grown homoepitaxially or heteroepitaxially on substrate 10. In the case of heteroepitaxial growth, n-type layer 20 may contain other layers used as buffer to accommodate the lattice mismatch between n-type layer 20 and substrate 10. In the case of GaN-based LEDs, n-type layer 20 can be made of Si-doped GaN. N-type layer 20 can be any suitable n-type layer conventionally used in the field. Substrate 10 can be GaN, sapphire, silicon carbide, gallium arsenide, and the like used in the field. On top of n-type layer 20 is formed an insulating layer 30. It can be insulating GaN such as intrinsic GaN, iron doped GaN, or highly compensated doped GaN, or insulating AlGaN or AlN. Insulating layer 30 is used for electrical isolation so its resistivity is preferred to be high, preferably to be higher than 100 Ω·cm, more preferably to be higher than 1000 Ω·cm, and its thickness should be greater than 0.1 µm, preferably be from 0.2 to 0.5 µm.

Mask 15 is used to define desirable one dimensional or two dimensional or irregular etch patterns such as those discussed previously. Etch depth should be large enough to allow MQW active-region 501 to be partially embedded in the recessed area of remaining n-type layer 20' (FIG. 3B and FIG. 3C). Referring to FIG. 3C, the combined etch depth of insulating layer 30 and n-type layer 20 is preferably in the range of 0.3 to 1.0 µm. MQW active-regions 501 and 502 are then deposited layer-by-layer simultaneously over the exposed top surface 201 of the remaining n-type layer 20' and the top surface 301 of the remaining insulating layer 30'. The MQW active-region 501 is in general made of alternate AlInGaN quantum barriers and AlInGaN quantum wells, with GaN or InGaN barriers and InGaN wells as a special case. Finally, over MQW active-regions 501 and 502 a thick p-type layer 60 is grown to finish the structure. Depending on the etch depth and the regrowth thickness, p-type layer 60 can have a flat surface (FIG. 3C) or an uneven surface (not shown). When the surface of p-type layer 60 is uneven, other materials with different refractive index can be filled to smooth the uneven surface of p-type layer 60, such as filling material 70 as shown in FIG. 2D.

When the device is forward biased, hole current and electron current are driven into MQW active-region 501, illustratively shown respectively by hollow arrows and solid arrows in FIG. 3C. Since the arrangement is that MQW active-region 501 strides over the sidewalls of the projection portions of remaining n-type 20' and the sidewalls of the remaining insulting layer 30', leakage current bypassing MQW 501 is forbidden.

In addition, referring to FIG. 3C, recovery layers 221 and 222 can be formed similarly as recovery n-type layer 22 described in connection with FIGS. 2A-2D. Furthermore, recovery layers 221 and 222 in this embodiment can be either an n-type layer or an insulating layer. When recovery layer 221 is an n-type layer, the lateral injected electron current is regulated by the cross-section area ratio of sidewalls of the projection portions of the remaining n-type layer 20' and the recessed surface area of the remaining n-type layer 20' covered by the recovery layer 221. When recovery layer 221 is an insulating layer, then the perpendicular electron injection into MQW active-region 501 is forbidden and only the lateral injection path is open, realizing a completely electron lateral injection. When recovery layer 221 is an insulating layer, if desirable, the insulating layer 221 can be made only to cover a portion of the recessed surface area of the remaining n-type layer 20', allowing partial perpendicular electron injection into MQW active-region 501.

The remaining insulating layer 30' serves to insulate the remaining n-type layer 20' from the p-type layer 60. As long as it can serve this purpose, the portion of the remaining insulating layer 30' that imbedded into MQW active-region 501 is preferably as thin as possible so that the projection portions of the remaining n-type layer 20' can have more contact area with MQW active-region 501, allowing more lateral electron injection from remaining n-type layer 20' into MQW active-region 501. Preferably, more than 50% of the thickness of active-region 501 is embedded into the recesses of remaining n-type layer 20', for example, more than 60%, 70%, or 80% of the thickness of active-region 501 is embedded into the recesses of remaining n-type layer 20'.

It should be noted that various layers in the embodiment shown in FIG. 3A-3C are the same as or similar to the corresponding ones in the embodiment shown in FIGS. 2A-2D, and can be formed in the same or similar process as used in the embodiment shown in FIGS. 2A-2D.

The remaining insulating layer 30' and the corresponding projection portions of the remaining n-type layer 20' below the remaining insulating layer 30' may have any suitable one or two dimensional patterns or any suitable regular/irregular patterns such as those shown in FIGS. 6 and 7, or combination thereof. For example, when FIG. 6 is taken as a top view of an example structure of FIG. 3B, the upwardly protruding strips are formed by a stack of the remaining insulating layer 30' and certain thickness of remaining n-type layer 20' with an upper surface 301. The recessed squares surrounded by the strips expose the upper surface 201 of the remaining n-type layer 20' for receiving recovery n-type layer 221 or for direct epitaxial growth of active-region 501. The recessed squares may be replaced by other regular or irregular shapes such as triangle, polygon, circle, or the combination of different shapes. In this embodiment, the strips have the same dimension as discussed previously. For example, in some embodiments, strip width d is in the range of 1-10 µm, such as 3 µm, or 6 µm, and square side length a in the range of 5-50 µm, such as 10 µm, 20 µm, 30 µm, or 40 µm.

FIG. 7 can be taken as a top view of another example structure of FIG. 3B. The circles with diameter d represent upwardly protruding lateral electron injecting cylinders, where d is less than a/2, for example less than a/4 or a/8, and a is the two dimensional lattice constant. In this case, the upwardly protruding lateral electron injecting cylinders are formed by a stack of the remaining insulating layer 30' and a certain thickness of remaining n-type layer 20' with an upper surface 301. The recessed areas other than the upwardly protruding lateral electron injecting cylinders expose the upper surface 201 of remaining n-type layer 20' for receiving recovery n-type layer 221 or for direct epitaxial growth of active-region 501. Here, the laterally injected electron current is proportional to $(d/a)^2$. The upwardly protruding lateral electron injecting cylinders may have other regular or irregular cross-sectional shapes other than circle shape.

Figure 4A:
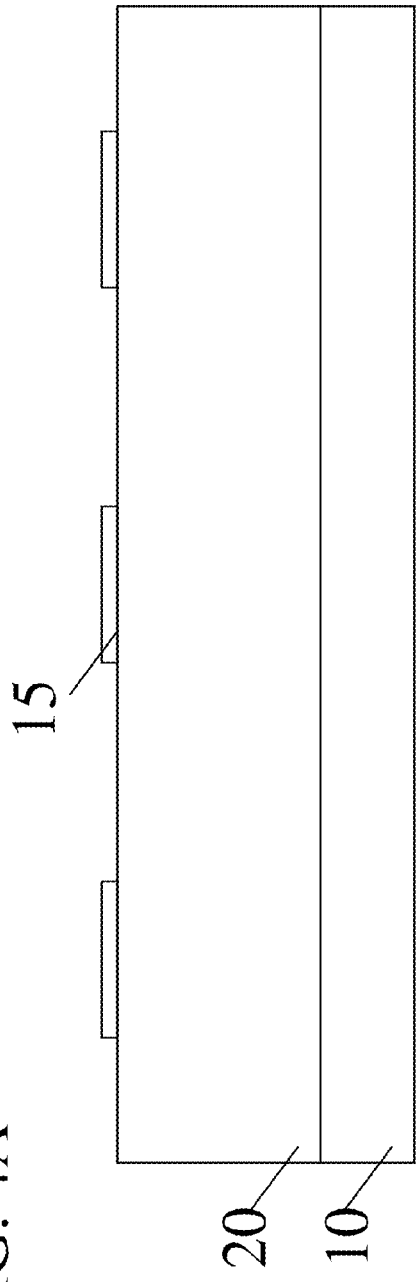
Figure 4B:
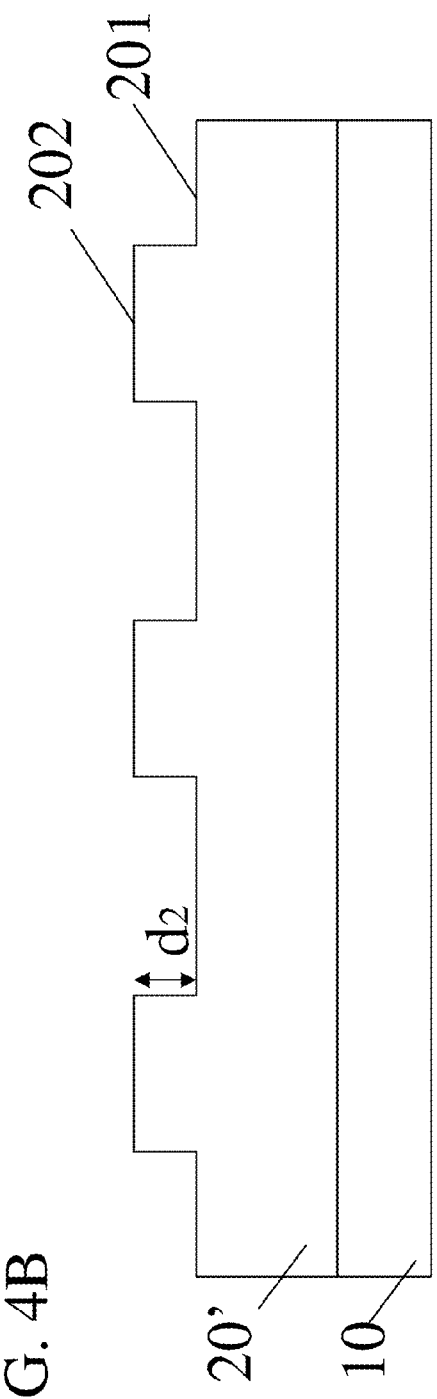
Figure 4C:
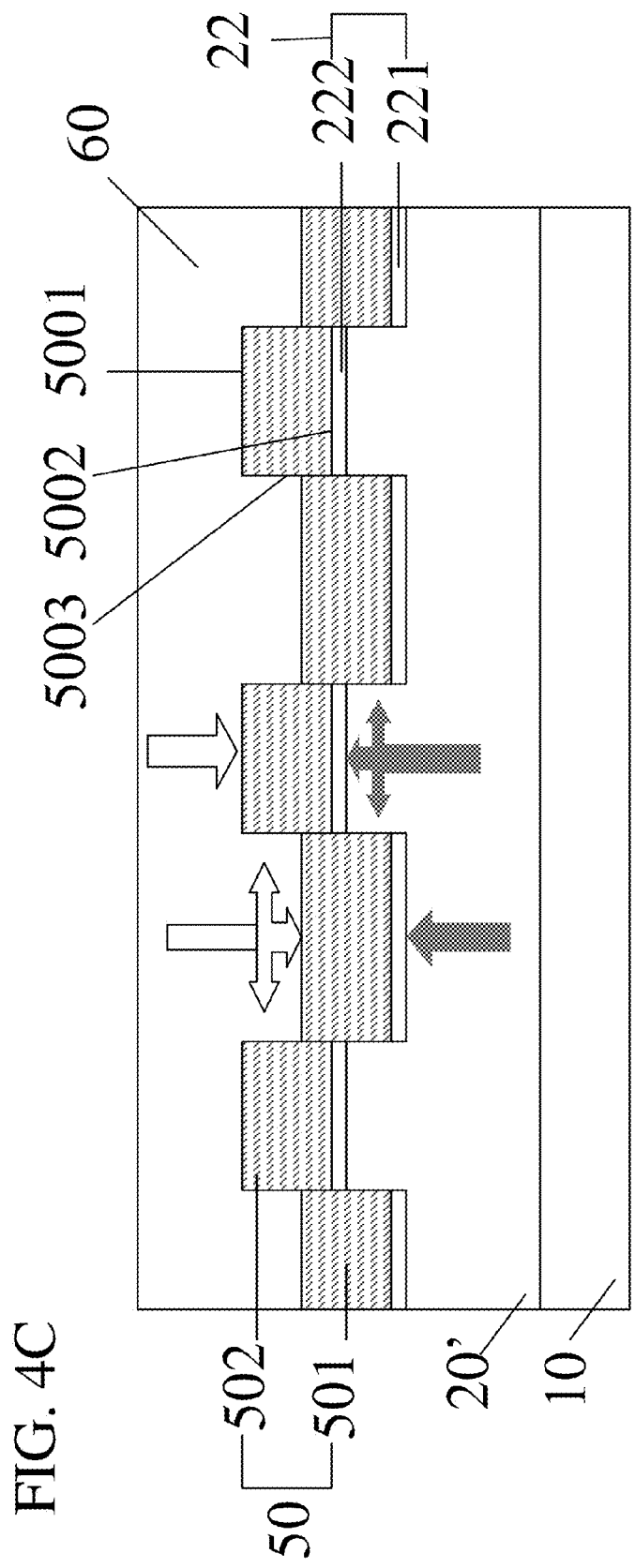
Figure 4D:
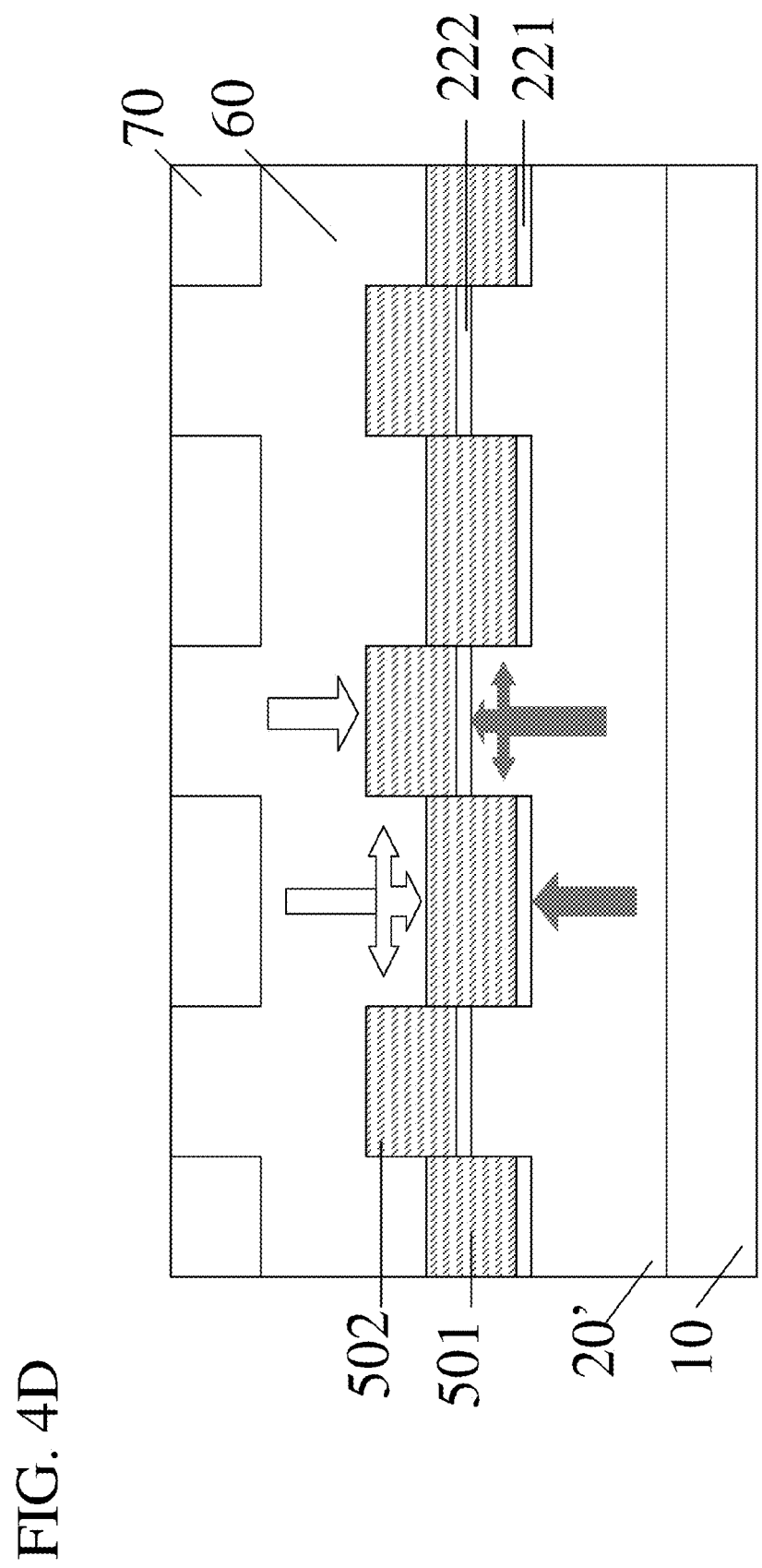

Still another embodiment is shown in FIG. 4A-FIG. 4D. As shown in FIG. 4A, an n-type layer 20 is deposited over a substrate 10. The n-type layer 20 can be grown homoepitaxially or heteroepitaxially on substrate 10. In the case of heteroepitaxial growth, n-type layer 20 may contain other layers used as a buffer layer to accommodate the lattice mismatch between n-type layer 20 and substrate 10. In the case of GaN-based LEDs, n-type layer 20 can be made of Si-doped GaN. N-type layer 20 can be any suitable n-type layer conventionally used in the field. Substrate 10 can be GaN, sapphire, silicon carbide, gallium arsenide, and the like used in the field. A mask 15 is formed on n-type layer 20 to define etch patterns. After being etched by a predetermined thickness, a plurality of recesses having substantially vertical sidewalls are formed on the remaining n-type layer 20', which lead to the formation of two groups of vertically displaced surfaces 201 and 202 separated by a distance $d_2$. Preferably, distance $d_2$ is in a range of 0.1 to 0.3 µm. Distance $d_2$ can also be smaller than 0.1 µm or larger than to 0.3 µm depending on the specific structure of a light emitting device. Next, an optional recovery n-type layer 22 is deposited on the remaining n-type layer 20', which includes a recovery n-type layer 221 formed on surface 201 and a recovery n-type layer 222 formed on surface 202. Then, an active-region such as an MQW active-region 50 is deposited, which includes an MQW active-region 501 formed on recovery n-type layer 221 and an MQW active-region 502 formed on recovery n-type layer 222. A p-layer 60 is deposited over MQW active-region 501 and MQW active-region 502. As depicted in FIG. 4C and FIG. 4D, MQW active-region 501 and MQW active-region 502 have some vertically overlapping areas, which serve to prevent leakage current path bypassing the MQW active-region 50. The vertically overlapping area should at least contain one quantum well layer, preferably 2-6 quantum well layers. MQW active-region 501 and MQW active-region 502 are vertically displaced, meaning at least some of the quantum well layers do not continue at the interface between MQW active-region 501 and MQW active-region 502. In other words, the edges of at least some of the quantum well layers are exposed by the sidewalls of MQW active-regions 501 and 502, so that electrons or holes can be laterally injected into the quantum well layers via the exposed edges thereof.

In the embodiment shown in FIGS. 4C-4D, the sidewalls of MQW active-regions 501 and 502 are substantially vertical. However, non-vertical sidewalls, inclined sidewalls, or other shaped sidewalls of MQW active-regions 501 and 502 can also be adopted in the present invention, as long as the edges of at least some of the quantum well layers are exposed for receiving lateral carrier injection.

In the embodiment shown in FIGS. 4C-4D, p-type layer 60 and n-type layer 20' are shown a single layer, respectively. It should be understood that p-type layer 60 can include multiple p-type layers with the same or different composition and n-type layer 20' can include multiple n-type layers with the same or different composition.

In the embodiment shown in FIGS. 4A-4B, the group of surfaces 201 are in a same plane and each being a flat surface, the group of surfaces 202 are in a same plane and each being a flat surface, and the sidewalls between surfaces 201 and surfaces 202 are substantially vertical. However, different surfaces 201 can be located in different planes with different height and can be a non-flat surface, different surfaces 202 can be located in different planes with different height and can be a non-flat surface, and the sidewalls between surfaces 201 and surfaces 202 can be non-vertical, inclined, or other shape. Accordingly, the top surfaces of MQW active-region 502 can be located in different planes with different height and can be a non-flat surface, and the bottom surfaces of MQW active-region 502 can be located in different planes with different height and can be a non-flat surface; similarly the top surfaces of MQW active-region 501 can be located in different planes with different height and can be a non-flat surface, and the bottom surfaces of MQW active-region 501 can be located in different planes with different height and can be a non-flat surface. Illustrated in FIG. 4E is an example showing that the top surfaces 202, and resultantly, MQW 502, sitting on different plane.

Figure 8:
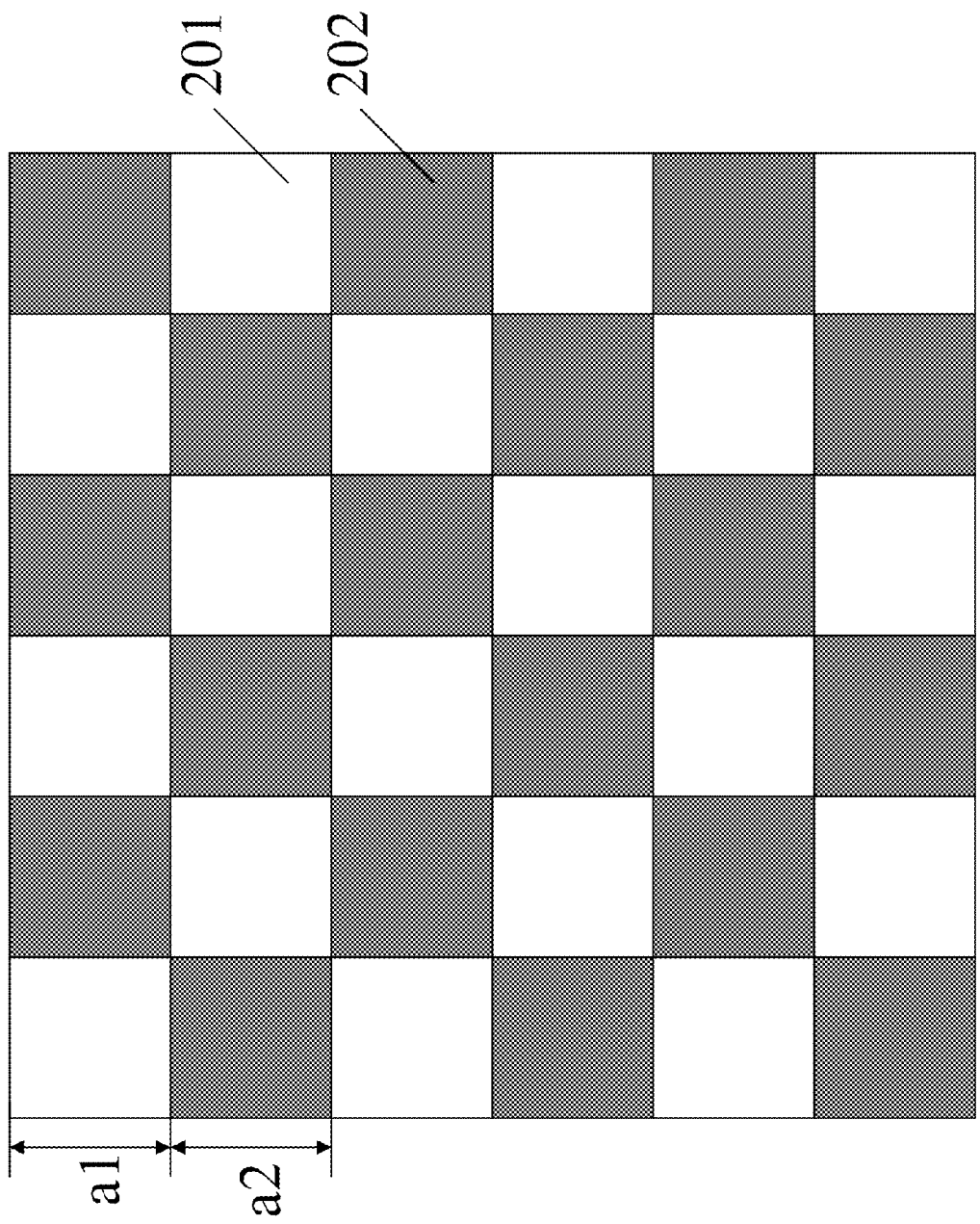
FIG. 8 shows an example of two-dimensional etch pattern, a chessboard.

This embodiment is capable of laterally injecting electrons and holes. Holes are laterally injected into MQW active-region 502 while electrons are laterally injected into MQW active-region 501. Since MQW active-region 501 and MQW active-region 502 both contribute to light emitting, etch pattern is preferably selected to give approximately equal area for the elevated and recessed areas. Though any suitable one dimensional or two dimensional patterns can be applied, as an example two dimensional pattern, a chessboard configuration is shown in FIG. 8, which is a top view of an example structure of FIG. 4B. As shown, the upwardly protruding squares have a top surface 202 and length $a_2$ in the range of 5-50 μm, for example length $a_2$ being 10 μm, 20 μm, 30 μm, or 40 μm. The recessed squares alternately arranged with the upwardly protruding squares have a bottom surface 201 and length $a_1$ in the range of 5-50 μm, for example length $a_1$ being 10 μm, 20 μm, 30 μm, or 40 μm. Top surface 202 and bottom 201 are for receiving recovery n-type layers 222 and 221, respectively, or for direct epitaxial growth of active-regions 501 and 502, respectively. The upward protruding squares and the recessed squares may be replaced by other regular or irregular shapes such as triangle, polygon, circle, or the combination of different shapes, and the upwardly protruding areas can be equal to, larger or smaller than the recessed areas. In the embodiment shown in FIG. 8, the upwardly protruding areas are equal to the recessed areas ($a_1=a_2$).

FIG. 6 can be taken as a top view of another example structure of FIG. 4B, the upwardly protruding strips are formed by the protruding portions of remaining n-type layer 20' with a top surface 202. The recessed squares surrounded by the strips expose surface 201 of remaining n-type layer 20'. Here, the recessed squares may be replaced by other regular or irregular shapes such as triangle, polygon, circle, or the combination of different shapes. One major difference between this embodiment and the structures shown in FIGS. 2A-2D and 3A-3C lies in that the adjacent active-regions 501 and 502 in this embodiment share a vertically overlapping portion, which serves to prevent leakage current path bypassing the MQW active-region 50 and contains at least one quantum well layer, preferably 2-6 quantum well layers. In some embodiments, a vertically overlapping portion of adjacent active-regions 501 and 502 contains more than 6 quantum well layers.

FIG. 7 can be taken as a top view of still another example structure of FIG. 4B. The circles with diameter d represent upwardly protruding lateral electron injecting cylinders, where d is less than a/2, for example less than a/4, and a is the two dimensional lattice constant. In this case, the upwardly protruding lateral electron injecting cylinders are formed by the protruding portion of remaining n-type layer 20' with a top surface 202. The recessed areas other than the upwardly protruding lateral electron injecting cylinders expose surface 201 of remaining n-type layer 20'. Surfaces 202 and 201 are for receiving recovery n-type layers 222 and 221, respectively, or for direct epitaxial growth of active-regions 501 and 502, respectively. Here, the laterally injected electron current is proportional to $(d/a)^2$. The upwardly protruding lateral electron injecting cylinders may have other regular or irregular cross-sectional shapes other than circle shape.

Further referring FIGS. 4C-4D, the active-region 50 can be described as containing a plurality of volume units, each being defined by a top surface 5001, a bottom surface 5002 and a sidewall 5003. Each volume unit contains multiple continuous well layers and barrier layers. Adjacent volume units are vertically displaced so that the top surfaces of the adjacent volume units are not in a plane, or the bottom surfaces of the adjacent volume units are not in a plane. The sidewalls of the volume units are divided into two groups. One group of sidewalls is exposed to the n-type layer for receiving electrons laterally injected from the n-type layer. The other group of sidewalls is exposed to the p-type layer for receiving holes laterally injected from the p-type layer. In the embodiment shown in FIGS. 4C-4D, active-region 501 contains the group of sidewalls that is exposed to the n-type layer, active-region 502 contains the group of sidewalls that is exposed to the p-type layer. Preferably, each of the sidewalls exposes more than one well layer, more preferably exposes more than half of the total well layers. The ratio of the contact surface area between the remaining n-type layer 20' and the sidewalls of active-region 501 to the contact surface area between the p-type layer 60 and the sidewalls of active-region 502 can be adjusted, for example, in the range of 0.5 to 2, preferably 0.8 to 1.5, by adjusting the relative size of active-regions 501 and 502. In some embodiments, the ratio is about 1. In some other embodiments, the ratio is less than 0.5, or larger than 1.5.

Further referring to FIG. 4B and FIGS. 6-8, in the embodiment shown in FIG. 8, each protruding square 202 and each recessed square 201 are adapted to accommodate one volume unit. In the embodiment shown in FIG. 6, each recessed square with bottom surface 201 accommodates one volume unit, while the strips with top surface 202 that surround the recessed squares accommodate one continuous volume unit conformable to the shape of the strips. In the embodiment shown in FIG. 7, each of the upwardly protruding lateral electron injecting cylinders with a top surface 202 accommodates one volume unit, while the recessed areas with surface 201 that surround the upwardly protruding lateral electron injecting cylinders accommodate one continuous volume unit.

In the embodiment shown in FIGS. 4C-4D, all of the volume units have the same number of well layers and barrier layers, and have substantially the same height. The top surfaces of the volume units substantially lie in two vertically separated planes, respectively. The bottom surfaces of the volume units substantially lie in two vertically separated planes, respectively. However, the present invention is not limited to this structure. For example, the top surfaces of the volume units may lie in three or more vertically separated planes, respectively, and the bottom surfaces of the volume units may lie in three or more vertically separated planes, respectively, as shown in FIG. 4E. It is also possible that all of the volume units do not have the same number of well layers and barrier layers, and do not have the same height. The sidewalls of the volume units can be substantially vertical, or inclined, or of other shape as long as the edges of at least some of the well layers are exposed by the sidewalls for receiving lateral injection of carriers.

In this embodiment, if layers 221 and 222 are insulating layers, MQW active-region 501 will have completely lateral electron injection contributing to light-generation, while MQW active-region 502 will probably contribute less to light-emitting since MQW 502 is then electrically connected between p-layer 60 and n-layer 20' via MQW 501.

Also, depending on the etch depth and the regrowth thickness, p-type layer 60 can have a flat surface (FIG. 4C) or an uneven surface (FIG. 4D). When p-type layer 60's surface is uneven, other materials with different refractive index can be filled to smooth the uneven surface. As shown in FIG. 4D, uneven surface of p-type layer 60 is smoothened out by filling material 70. Material 70 can be dielectrics like silicon dioxide, silicon nitride, or be transparent conducting oxides like ITO. Selection of proper material 70 can enhance the LED's light extraction efficiency.

FIGS. 4C-4D show p-type layer 60 covers the top surfaces of both MQW active-regions 501 and 502. Optionally, a thin insulating layer (not shown) can be deposited between p-type layer 60 and the top surfaces of MQW active-region 501 and 502, for example in direct contact with MQW active-region 501 and 502, then the perpendicular hole injection into MQW active-region 501 and 502 is forbidden and only lateral hole injection is allowed. If desirable, p-type layer 60 can be made partially in contact with MQW active-region 501 and 502, e.g., the thin insulating layer only covers a portion of MQW active-region 501 and 502 and the other portion of MQW active-region 501 and 502 is exposed to p-type layer 60. If desirable, other layers such as a p-type layer with higher energy band than p-type layer 60 can be formed between the p-type layer 60 and the top surfaces of MQW active-region 502 and 501.

Figure 5A:
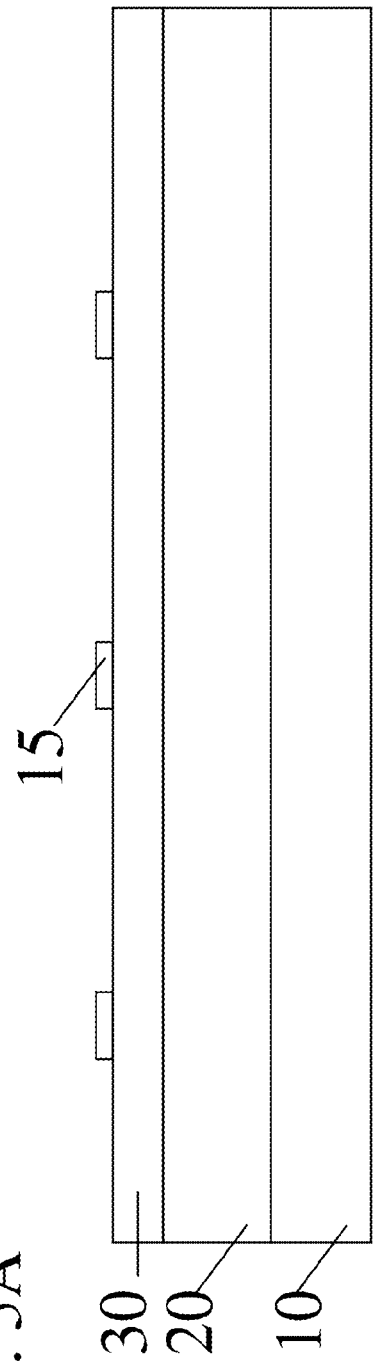
Figure 5B:
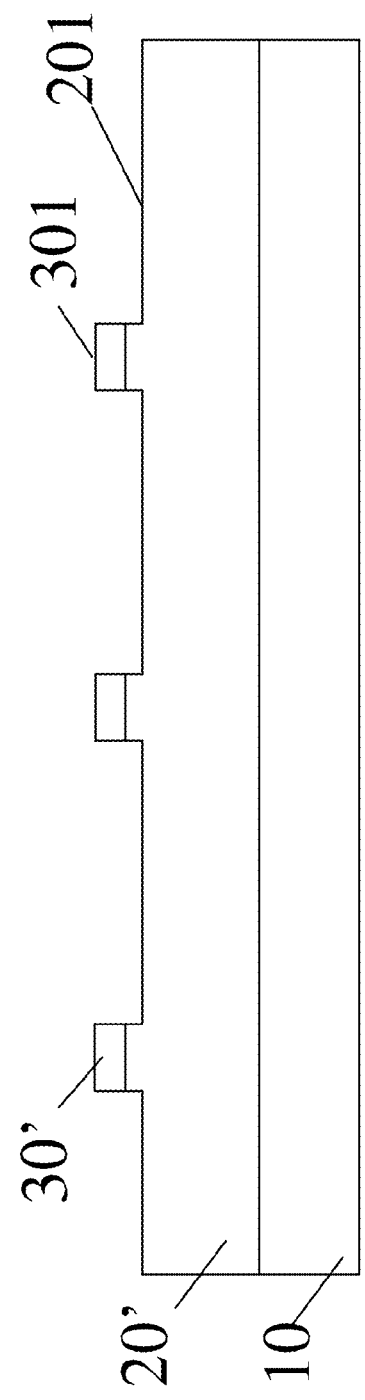
Figure 5C:
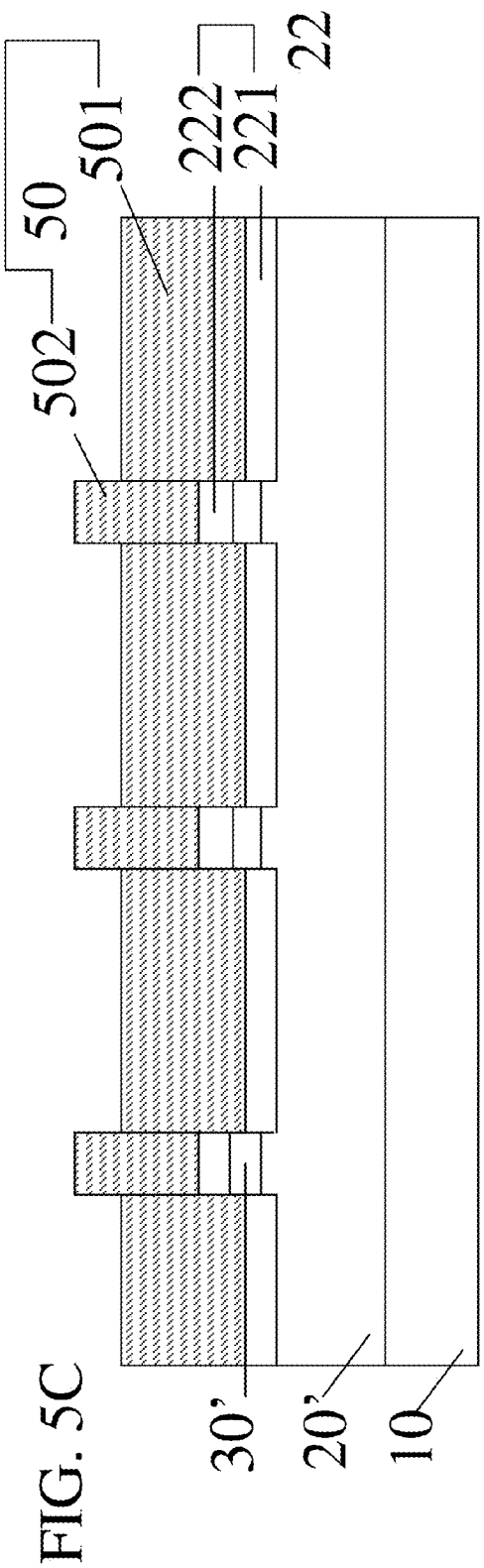
Figure 5D:
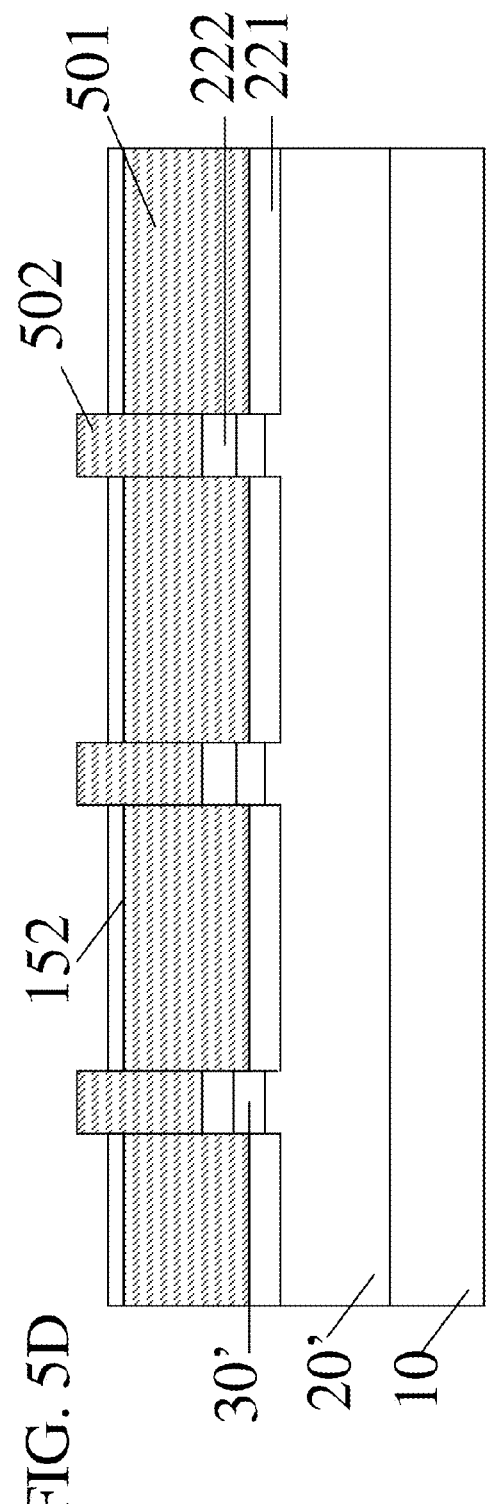

Lateral injection of holes and electrons into the same MQW active region is achieved in yet another embodiment. As shown in FIGS. 5A-5J, an n-type layer 20 is deposited over a substrate 10. The n-type layer 20 can be grown homoepitaxially or heteroepitaxially on substrate 10. In the case of heteroepitaxial growth, n-type layer 20 may contain other layers used as a buffer layer to accommodate the lattice mismatch between n-type layer 20 and substrate 10. In the case of GaN-based LEDs, n-type layer 20 can be made of Si-doped GaN. N-type layer 20 can be any suitable n-type layer conventionally used in the field. Substrate 10 can be GaN, sapphire, silicon, silicon carbide, quartz, zinc oxide, glass and gallium arsenide, and the like used in the field. An insulating layer 30 is deposited on n-type layer 20. A first mask 15 is formed on insulating layer 30 to define etch patterns. After etching, first mask 15 is removed to expose top surface 301 of remaining insulating layer 30' and top surface 201 of a portion of remaining n-type layer 20'. The two groups of surfaces 301 and 201 are vertically displaced as shown in FIG. 5B, for the following LED structure growth, which starts with the deposition of an optional recovery n-type layer 22 to recover/refresh the etched surfaces of n-type layer 20 for next MQW active-region growth. The optional recovery n-type layer 22 includes a recovery n-type layer 221 formed on surfaces 201 of the remaining n-type layer 20' and a recovery n-type layer 222 formed on surfaces 301 of the remaining insulating layer 30'. Then an active-region such as an MQW active-region 50 is deposited, which includes an MQW active-region 501 formed on the recovery n-type layer 221 and an MQW active-region 502 formed on the recovery n-type layer 222. A second mask 152 is formed covering MQW active-region 501 and exposing MQW active-region 502. Etching is conducted to partially or completely remove MQW active-region 502 deposited on surfaces 301 or layer 222, so that sidewalls of MQW active-region 501 are exposed (FIG. 5D-FIG. 5E).

Second mask 152 is removed. Then growth of p-type layer 60 is performed (FIG. 5F). FIG. 5F shows p-type layer 60 covers both the top surfaces and sidewalls of MQW active-region 501. Optionally, a thin insulating layer (not shown) can be deposited between p-type layer 60 and the top surfaces of MQW active-region 501, for example in direct contact with MQW active-region 501, then the perpendicular hole injection into MQW active-region 501 is forbidden and only the lateral injection path is open, realizing a completely hole lateral injection. If desirable, p-type layer 60 can be made partially in contact with MQW active-region 501, e.g., the thin insulating layer only covers a portion of MQW active-region 501 and the other portion of MQW active-region 501 is exposed to p-type layer 60. If desirable, other layers such as a p-type layer with higher energy band than p-type layer 60 can be formed between the p-type layer 60 and the top surfaces of MQW active-region 501. Optionally, certain thickness of active-region 502 can be left unetched and, in the meantime, the sidewalls of active-region 501 are exposed to p-type layer 60.

Figure 5G:
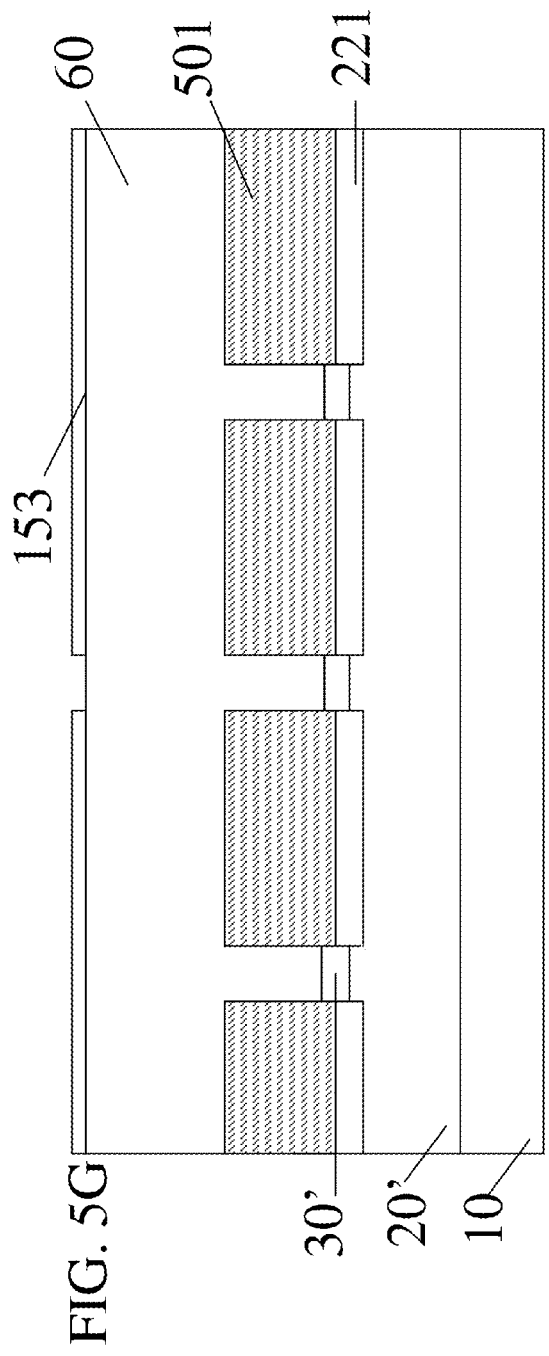
Figure 5H:
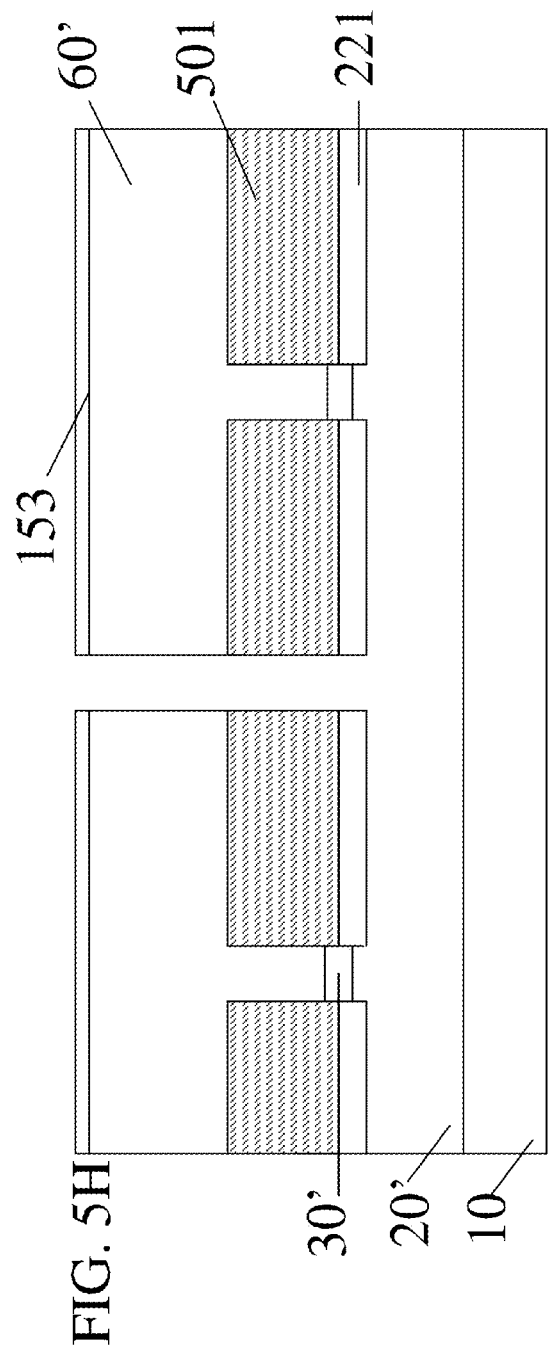

A third mask 153 is deposited on p-type layer 60 exposing portions that align with the areas where the removed MQW active-region 502 used to be and etching is conducted until remaining n-type layer 20' is exposed and sidewalls of MQW active-region 501 above the exposed remaining n-type layer 20' are also exposed (FIG. 5G-FIG. 5H). With third mask 153 in place, an n-type layer 223 is deposited on the exposed remaining n-type layer 20', being in contact with the exposed sidewalls of MQW active-region 501, and an insulating layer 302 is formed on the n-type layer 223 to separate n-type layer 223 from p-type layer 60 (FIG. 5I). The uneven areas (if any) can be filled with optical material 70. Finally, third mask 153 and any depositions thereon are removed to get the final device structure shown in FIG. 5J.

To adjust the ratio of lateral hole and electron injection, the number of electron injection plugs formed by n-type layer 223 and the insulating layer 302 and the number of hole injection plugs formed by the portions of p-type layer 60 formed between sidewalls of MQW active-region 501 can be adjusted. For example, the ratio of the number of electron injection plugs to the number of hole injection plugs can be between 0.1 to 2, preferably 0.5 to 1. Or the ratio of the contact surface between electron injection plugs and the sidewalls of MQW active-region 501 to the contact surface between hole injection plugs and the sidewalls of MQW active-region 501 can be adjusted, for example, in the range of 0.1 to 2, preferably 0.5 to 1.

As schematically shown in FIG. 5J, holes and electrons are be able to be laterally injected into the same areas of MQW active-region 501. Also, if n-type layer 221 is replaced with an insulating layer, a complete lateral electron injection is realized. On the other hand, if a thin insulating layer (not shown in FIG. 5F-FIG. 5J) is deposited between the p-type layer 60 and the top surfaces of MQW active-region 501, for example in direct contact to MQW active-region 501, then the perpendicular hole injection into MQW active-region 501 is forbidden and only the lateral injection path is open, realizing a completely hole lateral injection. With the presence of an insulating layer 221 and a thin insulating layer deposited between the p-type layer 60 and top surfaces of MQW active-region 501, a complete lateral injection of electrons and holes into the same MQW active-region 501 is achieved. This will minimize heat generation in the MQW to the greatest extent, and will have the most uniform carrier distribution the MQW. If desirable, other layers such as a p-type layer with higher energy band than p-type layer 60 can be formed between the p-type layer 60 and the top surfaces of MQW active-region 501.

Further, in the above embodiments, the principle of the present invention is illustrated with n-type layers being deposited on a substrate side. It should be understood that the same principle can be applied to LEDs with p-layers being deposited on a substrate side. For example, in FIGS. 4A-4D, the layers 20 (20') and 22 (221 and 222) can be p-type layers, and layer 60 can be an n-type layer. Because of the vertically displaced MQW configuration, holes and electrons have lateral injection paths into the MQW.

Referring to FIG. 1, the lateral carrier injection reduces or avoids heat generation in the MQW associated with heterointerface band discontinuity. This is expected to benefit LEDs' internal quantum efficiency. Also, according to the present invention, the lateral carrier injection means that all quantum well layers or at least some of the quantum well layers in the MQW are electrically connected in parallel. In the prior art LEDs, quantum wells in MQW are electrically connected in series. Parallel connection means much less resistance than series connection, which is preferred in LEDs. In addition, as shown in FIG. 1, in c-plane nitride-based LEDs, polarization fields within the MQW are in the perpendicular direction, and are against carrier's injection if carriers are injected perpendicular to the MQW. According to the present invention, lateral carrier injection will result in much less heat generation since now carriers are not injected against the polarization fields.

The MQW used in the present invention can emit monochromatic color, or can be configured to emit multiple color emissions. In order to emit multiple color emissions, quantum wells in the MQW may have different bandgap, i.e., different composition. In the prior art LEDs, because of the difficulty to have uniform non-equilibrium electron/hole distribution in the MQW growth direction, it is practically very difficult to realize multiple color LEDs. The present invention using displaced MQW configuration enabling electron/hole lateral injection instead of, or in addition to, perpendicular injection, uniform injected carriers in the whole MQW active-region is realized, and multiple-color LEDs can be fabricated. An example of multiple-color LED is an LED emitting red, green, and blue emissions, mixed to form high-quality white light.

The present displaced active-region design also allows for very thick active-region adoption for very high power light emitting devices. In the prior art, thick active-region, such as MQW with well/barrier pairs more than 20 is practically difficult to be utilized, because of the increasing device forward voltage and light self-absorption. According to the present invention, the active-region is displaced. This arrangement on one hand greatly reduces light self-absorption by the active-region, on the other hand, allows for lateral carrier injection into the active-region for a uniform carrier distribution in all the quantum wells. The thicker the active-region, the more the exposed sidewall area of the active-region, thus the greater portion of the laterally injected current is implemented. This enables more uniform carrier distribution in the active-region and more light-emitting volumes. The present invention allows for MQW pairs more than 20 barrier/well pairs, preferably more than 50 pairs, for example more than 100 pairs. For a 100-pair MQW active-region design, the etch depth for displacing the recessed and elevated MQW 502 and 501, for example, $d_2$ in FIG. 4B, preferably is larger than 2 microns.

The present invention also enables quantum wells with very thick barriers. In the prior art, quantum barrier thickness is limited to be less than 100 nm because of the injected minority carrier diffuse length. According to one aspect of the present invention, electron supplier layer and hole supplier layer can contact the active-region from lateral side. This means that carriers can be injected into the quantum wells directly, without the need to pass through the quantum barriers. Thus very thick barriers can be applied in the LED embodiments according to the present invention. The thickness of individual quantum barrier layer according to the present invention can be in the range of 5 to 1000 nm, for example 10-500 nm, 10-300 nm, 100-300 nm, or 100-200 nm.

According to the present invention, the thickness of each individual well layer can be in the range of 1-5 nm. The total thickness of the active-region can be in the range from 200 nm to 5000 nm, for example, 400 nm to 1000 nm, or 500 nm to 900 nm. The MQW active-region can contain 2-200 pairs of the well layers and the barrier layers, for example 10-100 pairs, or 20-50 pairs. In some embodiments, at least two of the well layers emit different wavelength emissions with a peak wavelength difference at least 10 nm, or at least 20 nm, or at least 50 nm.

Though the attached figures in the specification shows starting with n-type layers from substrate, it is understood that the principal of the present invention can be applied to structures starting from a p-type layer.

The present invention has been described using exemplary embodiments. However, it is to be understood that the scope of the present invention is not limited to the disclosed embodiments. On the contrary, it is intended to cover various modifications and similar arrangement or equivalents. The scope of the claims, therefore, should be accorded the broadest interpretation so as to encompass all such modifications and similar arrangements and equivalents.

What is claimed is:

1. A method for manufacturing a light-emitting device comprising:
   providing an n-type layer deposited over a substrate;
   patterning the n-type layer to form a plurality of recesses defining a first group of surfaces and a second group of surfaces vertically displaced from the first group of surfaces;
   depositing an active-region over and conformable to the first group of surfaces and the second group of surfaces of the n-type layer, so that a first portion of the active-region is formed on the first group of surfaces and a second portion of the active-region is formed on the second group of surfaces, wherein the first portion of the active-region is vertically displaced from the second portion of the active-region; and
   depositing a p-type layer over and conformable to the active-region.

2. The method for manufacturing a light-emitting device according to claim 1, wherein the step of depositing the active-region includes alternately depositing multiple well layers and barrier layers, sidewalls of the first portion of the active-region that are in contact with the n-type layer expose at least one well layer and sidewalls of the second portion of the active-region that are in contact with the p-type layer expose at least one well layer.

3. The method for manufacturing a light-emitting device according to claim 1, before depositing the active-region, further depositing a recovery n-type layer on the n-type layer, which covers the first group of surfaces and the second group of surfaces of the n-type layer.

4. The method for manufacturing a light-emitting device according to claim 1, before depositing the active-region, further depositing an insulating layer on the n-type layer, which covers the first group of surfaces and the second group of surfaces of the n-type layer, but does not cover sidewalls connecting the first group of surfaces and the second group of surfaces.

5. A method for manufacturing a light-emitting device comprising:
   providing an n-type layer deposited over a substrate;
   forming an insulating layer on the n-type layer;
   patterning the insulating layer to remove exposed portion of the insulating layer and a portion of the n-type layer below the exposed portion of the insulating layer, resulting in a first group of surfaces of a remaining insulation layer and a second group of surfaces of a remaining n-type layer vertically displaced with the first group of surfaces;
   depositing an active-region, so that a first portion of the active-region is formed on the first group of surfaces and a second portion of the active-region is formed on the second group of surfaces;
   removing the first portion of the active-region to expose the remaining insulating layer;
   depositing a p-type layer over the active-region to cover top surface of the active-region, wherein a portion of the p-type layer fills the space that was occupied by the removed first portion of the active-region to form a plurality of hole injection plugs;
   patterning and etching the p-type layer to remove some of the hole injection plugs and the remaining insulating layer therebeneath until the n-type layer is expose so as to form a plurality of electron injection plug holes; and
   depositing another n-type layer into the plurality of electron injection holes to form a plurality of electron injection plugs; and
   depositing another insulating layer on the plurality of electron injection plugs to insulate the plurality of electron injection plugs from the p-type layer.

6. The method for manufacturing a light-emitting device according to claim 5, wherein the step of depositing the active-region includes alternately depositing multiple well layers and barrier layers, the hole injection plugs are in contact with at least one well layer, and the electron injection plugs are in contact with at least one well layer.

7. The method for manufacturing a light-emitting device according to claim 5, before depositing the active-region, further depositing a recovery n-type layer on the n-type layer, which covers the first group of surfaces and the second group of surfaces.

8. A method for manufacturing a light-emitting device comprising:
   providing a p-type layer, an insulating layer, and an n-type layer deposited over a substrate;
   patterning and etching the p-type layer and the insulating layer until the n-type layer is exposed, so as to form a plurality of projections containing a remaining portion of the p-type layer and a remaining portion of the insulating layer;
   depositing an active-region with multiple well layers and barrier layers over the substrate so that the projections penetrate the active-region and expose the remaining portion of the p-type layer to more than one well layers.

9. The method for manufacturing a light-emitting device according to claim 8, wherein the step of patterning and etching the p-type layer and the insulating layer etches into the n-type layer for a predetermined thickness.

* * * * *